(12) United States Patent
Kanungo et al.

(10) Patent No.: US 11,201,109 B2
(45) Date of Patent: Dec. 14, 2021

(54) HERMETIC METALLIZED VIA WITH IMPROVED RELIABILITY

(71) Applicant: CORNING INCORPORATED, Corning, NY (US)

(72) Inventors: Mandakini Kanungo, Painted Post, NY (US); Prantik Mazumder, Ithaca, NY (US); Chukwudi Azubuike Okoro, Painted Post, NY (US); Ah-Young Park, Daejeon (KR); Scott Christopher Pollard, Big Flats, NY (US); Rajesh Vaddi, Corning, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 16/776,663

(22) Filed: Jan. 30, 2020

(65) Prior Publication Data

US 2020/0165160 A1 May 28, 2020

Related U.S. Application Data

(63) Continuation of application No. 16/376,467, filed on Apr. 5, 2019.
(Continued)

(51) Int. Cl.
*H01L 23/15* (2006.01)
*H01L 23/48* (2006.01)
(Continued)

(52) U.S. Cl.
CPC ........ *H01L 23/49827* (2013.01); *C03C 3/06* (2013.01); *C03C 15/00* (2013.01);
(Continued)

(58) Field of Classification Search
None
See application file for complete search history.

(56) References Cited

U.S. PATENT DOCUMENTS 208,387 A 9/1878 Geoege
237,571 A 2/1881 Messier
(Continued)

FOREIGN PATENT DOCUMENTS

CN 100494879 C 6/2009
CN 104768320 A 7/2015
(Continued)

OTHER PUBLICATIONS

Machine Translation of JP-2018163986-A, Oct. 2018 (Year: 2018).*
(Continued)

*Primary Examiner* — Jeffrey A Vonch
(74) *Attorney, Agent, or Firm* — Amy T. Lang; John P. McGroarty

(57) ABSTRACT

According to various embodiments described herein, an article comprises a glass or glass-ceramic substrate having a first major surface and a second major surface opposite the first major surface, and a via extending through the substrate from the first major surface to the second major surface over an axial length in an axial direction. The article further comprises a helium hermetic adhesion layer disposed on the interior surface; and a metal connector disposed within the via, wherein the metal connector is adhered to the helium hermetic adhesion layer. The metal connector coats the interior surface of the via along the axial length of the via to define a first cavity from the first major surface to a first cavity length, the metal connector comprising a coating thickness of less than 12 μm at the first major surface. Additionally, the metal connector coats the interior surface of the via along the axial length of the via to define a second cavity from the second major surface to a second cavity
(Continued)

length, the metal connector comprising a coating thickness of less than 12 μm at the second major surface and fully fills the via between the first cavity and the second cavity.

14 Claims, 10 Drawing Sheets

Related U.S. Application Data

(60) Provisional application No. 62/801,408, filed on Feb. 5, 2019, provisional application No. 62/654,869, filed on Apr. 9, 2018, provisional application No. 62/801,408, filed on Feb. 5, 2019, provisional application No. 62/808,566, filed on Feb. 21, 2019.

(51) Int. Cl.

| | |
|---|---|
| *H01L 23/492* | (2006.01) |
| *H01L 23/498* | (2006.01) |
| *H05K 1/02* | (2006.01) |
| *H05K 1/03* | (2006.01) |
| *H05K 1/11* | (2006.01) |
| *C23C 14/18* | (2006.01) |
| *C23C 18/38* | (2006.01) |
| *C23C 28/02* | (2006.01) |
| *H01L 21/768* | (2006.01) |
| *C03C 17/06* | (2006.01) |
| *C03C 3/06* | (2006.01) |
| *C03C 15/00* | (2006.01) |
| *C03C 23/00* | (2006.01) |
| *H05K 3/38* | (2006.01) |
| *C25D 7/12* | (2006.01) |
| *C03C 3/076* | (2006.01) |
| *H01L 21/48* | (2006.01) |
| *H01L 23/00* | (2006.01) |
| *H05K 3/00* | (2006.01) |
| *H05K 3/42* | (2006.01) |

(52) U.S. Cl.
CPC .......... *C03C 17/06* (2013.01); *C03C 23/0025* (2013.01); *C23C 14/18* (2013.01); *C23C 18/38* (2013.01); *C23C 28/02* (2013.01); *H01L 21/76877* (2013.01); *H01L 23/15* (2013.01); *H01L 23/481* (2013.01); *H01L 23/49838* (2013.01); *H05K 1/0271* (2013.01); *H05K 1/0306* (2013.01); *H05K 1/115* (2013.01); *H05K 3/388* (2013.01); *C03C 3/076* (2013.01); *C25D 7/123* (2013.01); *H01L 21/486* (2013.01); *H01L 23/4924* (2013.01); *H01L 23/49866* (2013.01); *H01L 23/564* (2013.01); *H05K 3/002* (2013.01); *H05K 3/0029* (2013.01); *H05K 3/0055* (2013.01); *H05K 3/423* (2013.01); *H05K 3/425* (2013.01); *H05K 3/428* (2013.01); *H05K 2201/068* (2013.01); *H05K 2201/0989* (2013.01); *H05K 2201/09545* (2013.01); *H05K 2201/09563* (2013.01); *H05K 2201/09609* (2013.01); *H05K 2201/09827* (2013.01); *H05K 2201/09854* (2013.01); *H05K 2201/10378* (2013.01); *H05K 2203/1194* (2013.01); *H05K 2203/1361* (2013.01); *H05K 2203/143* (2013.01); *H05K 2203/1438* (2013.01); *H05K 2203/162* (2013.01); *Y10T 428/24273* (2015.01); *Y10T 428/24479* (2015.01); *Y10T 428/24851* (2015.01); *Y10T 428/24917* (2015.01); *Y10T 428/24926* (2015.01)

(56) References Cited

U.S. PATENT DOCUMENTS

| | | | |
|---|---|---|---|
| 3,798,013 | A | 3/1974 | Hasegawa et al. |
| 4,214,886 | A | 7/1980 | Shay et al. |
| 4,395,271 | A | 7/1983 | Beall et al. |
| 4,776,869 | A | 10/1988 | Offenbacher et al. |
| 5,166,037 | A | 11/1992 | Atkinson et al. |
| 5,340,947 | A | 8/1994 | Credle et al. |
| 5,745,236 | A | 4/1998 | Haga |
| 5,746,884 | A | 5/1998 | Gupta et al. |
| 5,909,284 | A | 6/1999 | Nakamura |
| 5,933,230 | A | 8/1999 | Imaino et al. |
| 5,969,422 | A | 10/1999 | Ting et al. |
| 6,072,624 | A | 6/2000 | Dixon et al. |
| 6,077,780 | A | 6/2000 | Dubin |
| 6,234,755 | B1 | 5/2001 | Bunker et al. |
| 6,344,242 | B1 | 2/2002 | Stolk et al. |
| 6,406,777 | B1 | 6/2002 | Boss et al. |
| 6,734,101 | B1 | 5/2004 | Bao et al. |
| 6,906,795 | B2 | 6/2005 | Goto et al. |
| 6,951,816 | B2 | 10/2005 | Nopper et al. |
| 7,019,257 | B2 | 3/2006 | Stevens |
| 7,043,072 | B2 | 5/2006 | Goto et al. |
| 7,211,899 | B2 | 5/2007 | Taniguchi et al. |
| 7,407,889 | B2 | 8/2008 | Tsunetomo et al. |
| 7,514,149 | B2 | 4/2009 | Bocko et al. |
| 7,528,967 | B2 | 5/2009 | Okawauchi et al. |
| 7,626,665 | B2 | 12/2009 | Koike |
| 7,683,370 | B2 | 3/2010 | Kugimiya et al. |
| 7,749,809 | B2 | 7/2010 | How et al. |
| 7,894,870 | B1 | 2/2011 | Lucisano et al. |
| 7,994,503 | B2 | 8/2011 | Hino et al. |
| 8,119,462 | B2 | 2/2012 | Takasawa et al. |
| 8,163,649 | B2 | 4/2012 | Koike et al. |
| 8,187,716 | B2 | 5/2012 | Sutter et al. |
| 8,338,957 | B2 | 12/2012 | Nilsson |
| 8,354,337 | B2 | 1/2013 | Matsumoto et al. |
| 8,384,083 | B2 | 2/2013 | Mori et al. |
| 8,411,459 | B2 | 4/2013 | Yu et al. |
| 8,482,189 | B2 | 7/2013 | Goto et al. |
| 8,531,679 | B2 | 9/2013 | Scheiner |
| 8,535,997 | B2 | 9/2013 | Kawakami et al. |
| 8,569,165 | B2 | 10/2013 | Gordon et al. |
| 8,643,129 | B2 | 2/2014 | Laming et al. |
| 8,673,779 | B1 | 3/2014 | Yoon et al. |
| 8,699,037 | B2 | 4/2014 | Cox |
| 8,742,588 | B2 | 6/2014 | Nilsson et al. |
| 8,836,126 | B2 | 9/2014 | Ochimizu et al. |
| 8,871,641 | B2 | 10/2014 | Nilsson |
| 8,873,067 | B2 | 10/2014 | Lee et al. |
| 9,024,443 | B2 | 5/2015 | Inaba et al. |
| 9,093,381 | B2 | 7/2015 | Barriere et al. |
| 9,140,539 | B2 | 9/2015 | Scheiner |
| 9,232,652 | B2 | 1/2016 | Fushie et al. |
| 9,236,274 | B1 | 1/2016 | Mobley et al. |
| 9,278,886 | B2 | 3/2016 | Boek et al. |
| 9,296,646 | B2 | 3/2016 | Burket et al. |
| 9,305,470 | B2 | 4/2016 | Miki et al. |
| 9,337,060 | B1 | 5/2016 | Mobley et al. |
| 9,346,706 | B2 | 5/2016 | Bazemore et al. |
| 9,374,892 | B1 | 6/2016 | Mobley et al. |
| 9,377,583 | B2 | 6/2016 | Giaretta et al. |
| 9,517,963 | B2 | 12/2016 | Marjanovic et al. |
| 9,656,909 | B2 | 5/2017 | Burket et al. |
| 9,676,046 | B2 | 6/2017 | Hamada et al. |
| 9,745,220 | B2 | 8/2017 | Burket et al. |
| 9,760,986 | B2 | 9/2017 | Ramamurthy et al. |
| 9,832,868 | B1 | 11/2017 | Wright et al. |
| 9,850,160 | B2 | 12/2017 | Marjanovic et al. |
| 10,144,093 | B2 | 12/2018 | Marjanovic et al. |
| 10,203,476 | B2 | 2/2019 | Cui |
| 10,410,883 | B2 | 9/2019 | Bellman et al. |
| 10,440,835 | B1 * | 10/2019 | Grober ................ H05K 3/4038 |
| 10,454,571 | B2 | 10/2019 | Gutman et al. |
| 2002/0004301 | A1 | 1/2002 | Chen et al. |
| 2002/0051563 | A1 | 5/2002 | Goto et al. |
| 2002/0180015 | A1 | 12/2002 | Yamaguchi et al. |

(56) References Cited

U.S. PATENT DOCUMENTS

| | | |
|---|---|---|
| 2003/0082356 A1 | 5/2003 | Suemasu et al. |
| 2003/0137056 A1 | 7/2003 | Taniguchi et al. |
| 2003/0206651 A1 | 11/2003 | Goto et al. |
| 2003/0221967 A1 | 12/2003 | Tsuchida et al. |
| 2004/0058476 A1 | 3/2004 | Enquist et al. |
| 2004/0094524 A1 | 5/2004 | Stevens |
| 2004/0166340 A1 | 8/2004 | Cairns et al. |
| 2004/0203181 A1 | 10/2004 | Shang et al. |
| 2004/0235294 A1 | 11/2004 | Imori et al. |
| 2004/0256619 A1 | 12/2004 | Nomura et al. |
| 2005/0029238 A1 | 2/2005 | Chen |
| 2005/0033184 A1 | 2/2005 | Christoph |
| 2005/0064707 A1 | 3/2005 | Sinha |
| 2005/0067295 A1 | 3/2005 | Dory et al. |
| 2005/0079650 A1 | 4/2005 | Mancini et al. |
| 2005/0266320 A1 | 12/2005 | Amemiya |
| 2006/0012766 A1 | 1/2006 | Klosner et al. |
| 2006/0093732 A1 | 5/2006 | Schut et al. |
| 2006/0192978 A1 | 8/2006 | Laguarta et al. |
| 2006/0233963 A1 | 10/2006 | Imori et al. |
| 2006/0283629 A1 | 12/2006 | Kikuchi et al. |
| 2007/0187142 A1 | 8/2007 | Suemasu et al. |
| 2008/0054467 A1 | 3/2008 | Ohba et al. |
| 2008/0067073 A1 | 3/2008 | Kagawa et al. |
| 2008/0087549 A1 | 4/2008 | Ishizuka et al. |
| 2008/0150138 A1 | 6/2008 | Bright et al. |
| 2008/0296768 A1 | 12/2008 | Chebiam et al. |
| 2009/0029189 A1 | 1/2009 | Moriwaki et al. |
| 2009/0032510 A1 | 2/2009 | Ando et al. |
| 2009/0263965 A1 | 10/2009 | Gordon et al. |
| 2009/0283910 A1 | 11/2009 | Hinomura |
| 2010/0096712 A1 | 4/2010 | Knechtel |
| 2010/0133697 A1 | 6/2010 | Nilsson |
| 2010/0284027 A1 | 11/2010 | Scheiner |
| 2010/0320604 A1 | 12/2010 | Isobayashi |
| 2011/0032467 A1 | 2/2011 | Koike |
| 2011/0049718 A1 | 3/2011 | Matsumoto et al. |
| 2011/0132883 A1 | 6/2011 | Sheng et al. |
| 2011/0147055 A1 | 6/2011 | Ma et al. |
| 2011/0294649 A1 | 12/2011 | Gomez et al. |
| 2011/0308942 A1 | 12/2011 | Liu et al. |
| 2012/0013022 A1 | 1/2012 | Sabuncuoglu et al. |
| 2012/0048604 A1 | 3/2012 | Cornejo et al. |
| 2012/0092681 A1 | 4/2012 | Cox |
| 2012/0121870 A1 | 5/2012 | Toury et al. |
| 2012/0125892 A1 | 5/2012 | Shimoi et al. |
| 2012/0125893 A1 | 5/2012 | Shimoi et al. |
| 2012/0133047 A1 | 5/2012 | Besling et al. |
| 2012/0139127 A1 | 6/2012 | Beyne |
| 2012/0152843 A1 | 6/2012 | McEvoy et al. |
| 2012/0168412 A1 | 7/2012 | Hooper |
| 2012/0196071 A1 | 8/2012 | Cornejo et al. |
| 2012/0217165 A1 | 8/2012 | Feng et al. |
| 2012/0235969 A1 | 9/2012 | Burns et al. |
| 2012/0241919 A1 | 9/2012 | Mitani |
| 2012/0276743 A1 | 11/2012 | Won et al. |
| 2013/0026645 A1 | 1/2013 | Mohammed et al. |
| 2013/0050226 A1 | 2/2013 | Shenoy et al. |
| 2013/0062210 A1 | 3/2013 | Fushie et al. |
| 2013/0075146 A1 | 3/2013 | Fushie et al. |
| 2013/0089701 A1 | 4/2013 | Hooper et al. |
| 2013/0105213 A1 | 5/2013 | Hu et al. |
| 2013/0119555 A1 | 5/2013 | Sundaram et al. |
| 2013/0163801 A1 | 6/2013 | Ha et al. |
| 2013/0205835 A1 | 8/2013 | Giaretta et al. |
| 2013/0224492 A1 | 8/2013 | Bookbinder et al. |
| 2013/0228918 A1 | 9/2013 | Chen et al. |
| 2013/0247615 A1 | 9/2013 | Boek et al. |
| 2013/0249109 A1 | 9/2013 | Ma et al. |
| 2013/0286610 A1 | 10/2013 | Nakagawa |
| 2013/0330515 A1 | 12/2013 | Oh et al. |
| 2013/0337599 A1 | 12/2013 | Yun |
| 2013/0340480 A1 | 12/2013 | Nattermann et al. |
| 2014/0034374 A1 | 2/2014 | Cornejo et al. |
| 2014/0084466 A1 | 3/2014 | Matsumoto et al. |
| 2014/0127899 A1 | 5/2014 | Cabral, Jr. et al. |
| 2014/0144681 A1 | 5/2014 | Pushparaj et al. |
| 2014/0147623 A1 | 5/2014 | Shorey et al. |
| 2014/0147624 A1 | 5/2014 | Streltsov et al. |
| 2014/0154439 A1 | 6/2014 | Demartino et al. |
| 2014/0166199 A1 | 6/2014 | Bellman et al. |
| 2014/0170378 A1 | 6/2014 | Bellman et al. |
| 2014/0186617 A1 | 7/2014 | Zhang et al. |
| 2014/0199519 A1 | 7/2014 | Schillinger et al. |
| 2014/0254004 A1 | 9/2014 | Wooder et al. |
| 2014/0262801 A1 | 9/2014 | Jayaraju et al. |
| 2014/0300728 A1 | 10/2014 | Drescher et al. |
| 2014/0363971 A1 | 12/2014 | Matsumoto |
| 2014/0376006 A1 | 12/2014 | Scheiner |
| 2015/0021775 A1 | 1/2015 | Matsumoto et al. |
| 2015/0036065 A1 | 2/2015 | Yousefpor et al. |
| 2015/0060402 A1 | 3/2015 | Burkett et al. |
| 2015/0076677 A1 | 3/2015 | Ebefors et al. |
| 2015/0083469 A1 | 3/2015 | Sunohara et al. |
| 2015/0102498 A1 | 4/2015 | Enicks et al. |
| 2015/0166393 A1 | 6/2015 | Marjanovic et al. |
| 2015/0166395 A1 | 6/2015 | Marjanovic et al. |
| 2015/0166396 A1 | 6/2015 | Marjanovic et al. |
| 2015/0239775 A1 | 8/2015 | Amin et al. |
| 2015/0274583 A1 | 10/2015 | An et al. |
| 2015/0306847 A1 | 10/2015 | Bellman et al. |
| 2015/0329415 A1 | 11/2015 | Bellman et al. |
| 2015/0353348 A1 | 12/2015 | Vandemeer et al. |
| 2016/0026842 A1 | 1/2016 | Withers et al. |
| 2016/0107925 A1 | 4/2016 | Burket et al. |
| 2016/0111380 A1 | 4/2016 | Sundaram et al. |
| 2016/0166395 A9 | 6/2016 | Weiman |
| 2016/0176751 A1 | 6/2016 | Lautenschlaeger et al. |
| 2016/0199944 A1 | 7/2016 | Hosseini |
| 2016/0201474 A1 | 7/2016 | Slavens et al. |
| 2016/0204126 A1 | 7/2016 | Amano |
| 2016/0208387 A1 | 7/2016 | Liu et al. |
| 2016/0219704 A1 | 7/2016 | Vandemeer et al. |
| 2016/0237571 A1 | 8/2016 | Liu et al. |
| 2016/0282584 A1 | 9/2016 | Cui |
| 2016/0305764 A1 | 10/2016 | Cui et al. |
| 2016/0312365 A1 | 10/2016 | Cordonier et al. |
| 2016/0327744 A1 | 11/2016 | Giaretta et al. |
| 2016/0334203 A1 | 11/2016 | Cui et al. |
| 2016/0351410 A1 | 12/2016 | Fu et al. |
| 2016/0368100 A1 | 12/2016 | Marjanovic et al. |
| 2016/0376186 A1 | 12/2016 | Gross |
| 2017/0008122 A1 | 1/2017 | Wieland et al. |
| 2017/0036419 A1 | 2/2017 | Adib et al. |
| 2017/0160077 A1 | 6/2017 | Featherstone et al. |
| 2017/0207160 A1 | 7/2017 | Gowda et al. |
| 2017/0228884 A1 | 8/2017 | Yoshida |
| 2017/0229318 A1 | 8/2017 | Tsunetomo et al. |
| 2017/0252859 A1 | 9/2017 | Kumkar et al. |
| 2017/0276951 A1 | 9/2017 | Kumkar et al. |
| 2017/0287728 A1 | 10/2017 | Dahlberg et al. |
| 2017/0301585 A1 | 10/2017 | Koelling et al. |
| 2017/0363417 A1 | 12/2017 | Cui et al. |
| 2018/0057390 A1 | 3/2018 | Hackert et al. |
| 2018/0062342 A1 | 3/2018 | Comstock et al. |
| 2018/0068868 A1 | 3/2018 | Jaramillo et al. |
| 2018/0093914 A1 | 4/2018 | Akarapu et al. |
| 2018/0215647 A1 | 8/2018 | Ortner et al. |
| 2018/0249581 A1 | 8/2018 | Mamezaki et al. |
| 2018/0340262 A1 | 11/2018 | Hiranuma |
| 2018/0342450 A1* | 11/2018 | Huang ............... H01L 21/4864 |
| 2018/0342451 A1 | 11/2018 | Dahlberg et al. |
| 2019/0239353 A1 | 8/2019 | Jayaraman |
| 2019/0269013 A1 | 8/2019 | Takagi et al. |
| 2019/0273038 A1 | 9/2019 | Nagano et al. |
| 2019/0304877 A1 | 10/2019 | Mobley et al. |
| 2019/0327840 A1 | 10/2019 | Bookbinder et al. |
| 2020/0227277 A1 | 7/2020 | Brown et al. |
| 2021/0043464 A1 | 2/2021 | Nolet et al. |

FOREIGN PATENT DOCUMENTS

| | | |
|---|---|---|
| CN | 104897062 A | 9/2015 |
| CN | 105448809 A | 3/2016 |

(56) References Cited

FOREIGN PATENT DOCUMENTS

| | | |
|---|---|---|
| EP | 0247993 A1 | 12/1987 |
| EP | 280918 A2 | 9/1988 |
| EP | 2095698 B1 | 9/2011 |
| EP | 3166372 A1 | 5/2017 |
| JP | 2001-044197 A | 2/2001 |
| JP | 2002-134659 A | 5/2002 |
| JP | 2003-148931 A | 5/2003 |
| JP | 2004311919 A * | 11/2004 |
| JP | 2004-363212 A | 12/2004 |
| JP | 2005-257339 A | 9/2005 |
| JP | 2006-287019 A | 10/2006 |
| JP | 2007059796 A | 3/2007 |
| JP | 2008-288577 A | 11/2008 |
| JP | 2010-074017 A | 4/2010 |
| JP | 2011-171334 A | 9/2011 |
| JP | 2011-178642 A | 9/2011 |
| JP | 2013-106015 A | 5/2013 |
| JP | 2013-220958 A | 10/2013 |
| JP | 2014093406 A | 5/2014 |
| JP | 2015060981 A * | 3/2015 |
| JP | 2015-082598 A | 4/2015 |
| JP | 2015-095590 A | 5/2015 |
| JP | 2015-146410 A | 8/2015 |
| JP | 2016213253 A | 12/2016 |
| JP | 2017-022220 A | 1/2017 |
| JP | 2017-204527 A | 11/2017 |
| JP | 2018-113392 A | 7/2018 |
| JP | 2018163986 A | 10/2018 |
| KR | 100803004 B1 * | 2/2008 |
| KR | 10-2019-0003050 A | 1/2019 |
| WO | 94/00966 A1 | 1/1994 |
| WO | 03/21004 A1 | 3/2003 |
| WO | 2004024191 A2 | 3/2004 |
| WO | 2005/063645 A1 | 7/2005 |
| WO | 2008/110061 A1 | 9/2008 |
| WO | 2011/050073 A1 | 4/2011 |
| WO | 2012/027220 A2 | 3/2012 |
| WO | 2015/113023 A1 | 7/2015 |
| WO | 2015/157202 A1 | 10/2015 |
| WO | 2016/010954 A2 | 1/2016 |
| WO | 2016/089844 A1 | 6/2016 |
| WO | 2016/114133 A1 | 7/2016 |
| WO | 2016118683 A1 | 7/2016 |
| WO | 2016/176171 A1 | 11/2016 |
| WO | 2017/038075 A1 | 3/2017 |
| WO | 2017/062798 A1 | 4/2017 |
| WO | 2017/210376 A1 | 12/2017 |
| WO | 2018/101468 A1 | 6/2018 |
| WO | 2018/162385 A1 | 9/2018 |
| WO | 2019055745 A1 | 3/2019 |

OTHER PUBLICATIONS

Keusseyan et al., RDL Multilayer Metallization Approaches for TGV, Jan. 2017, Additional Conferences (Device Packaging, HiTEC, HiTEN, and CICMT) (Year: 2017).*

Allvia; "Allvia Launches New Product Lines for Through Glass Vias (TGV) and Through Quartz Vias (TQV)"; 2 Pages; https://www.allvia.com/news/1606_allvia_launches_new_product_lines_for_through_glass_vias_and_through_quartz_vias.html; retrieved on Sep. 30, 2019.

Bain et al; "Formation of Monolayers by the Coadsorption of Thiols on Gold: Variation in the Head Group, Tail Group, and Solvent"; Journal of the American Chemical Society; 111; pp. 7155-7164 (1989.

Cui et al; "The Evolution of Pd/Sn Catalytic Surfaces in Electroles Copper Deposition"; Journal of the Electrochemical Society; 158, (3), pp. D172-D177 (2011.

Demir et al; "First Demonstration of Reliable Copper-Plated 30m Diameter Through-Package-Vias in Ultra-Thin Bare Glass Interposers" 2014 IEEE 64th Electronic Components and Technology Conference (ECTC.

Demir et al; "Reliability of Copper Through-Package Vias in Bare Glass Interposers"; IEEE Transactions on Components, Packaging and Manufacturing Technology; vol. 7, No. 6; pp. 829-837; (2017.

Dixit et la; "Structural and Electronic Properties of a Mn Oxide Diffusion Barrier Layer Formed by Chemical Vapor Deposition"; IEEE Transactions on Device and Materials Reliability, vol. 11, No. 2; pp. 295-302 (2011.

Dow et al; "Through-Hole Filling by Copper Electroplating"; Journal of the Electrochemical Society, 155 (12) D750-D757, (2008.

Gordon et al; "Chemical Vapor Deposition (CVD) of Manganese Self-Aligned Diffusion Barriers for Cu Interconnections in Microelectronics"; Advanced Metallization Conference 2008; pp. 321-329 (2009.

Hunegnaw et al; Vitrocoat GI—Ultra-Thin Adhesive Layer for Metallization of Glass Interposer: 2015 10th International Microsystems, Packaging, Assembly, and Circuits Technology Conference (IMPACT) 4 Pages.

Intergrace, "Borosilicate Glass: Technical Glass by Pulles & Hanique: Duan & Pyrex," Pulles & Hanique B.V., 2 Pgs. Published Mar. 15, 2012, Retrieved From: https://web.archive.org/web/20120315092729/http://www.pulleshanique.com/02_borosilicate-glass.htm.

Kanemoto et al; "Electroless Copper Plating Process by Applying Alternating One-Side Air Stirring Method for High-Aspect-Ratio Through-Holes"; J. Electrochem. Soc. 2017 vol. 164, Issue 12, D771-D777.

Liu et al; "Electroless and Electrolytic Copper Plating of Glass Interposer Combined With Metal Oxide Adhesion Layer for Manufacturing 3D RF Devices"; IEEE 66th Electronic Components and Technology Conference; pp. 62-67 (2016.

Lu et al; "Thermo-Mechanical Reliability of 3-D Ics Contianing Through Silicon Vias"; IEEE Electronic Components and Technology Conference; pp. 630-634 (2009.

U.S. Appl. No. 16/578,751 Titled; "Methods for Increasing Adhesion Between Metallic Films and Glass Surfaces and Articles Made Therefrom", Bookbinder et al; filed Sep. 23, 2019. 37 Pgs.

Metwalli et al; "Surface Characterization of Mono-, Di-, and Tri-Aminosiline Treated Glass Surface"; Journal of Colloid and Interface Science, 298 (2006) pp. 825-831.

Neishi et al; "Formation of a Manganese Oxide Barrier Layer With Thermal Chemical Vapor Deposition for Advanced Large-Scale Integrated Interconnect Structure"; Appl. Phys. Lett.; 93; pp. 032106-1-032106-3 (2008).

Ogutu et al; "Hybrid Method for Metallization of Glass Interposer"; Journal of the Electrochemical Society; vol. 160; No. 12; pp. D3228-D3236 (2013).

Ogutu et al; "Superconformal Filling of High Aspect Ration Through Glass Vias (TGV) for Interposer Applications Using TNBT and NTBC Additives"; Journal of the Electrochemical Society; 162 (9) pp. D457-D464 (2015).

Pallavicini et al; "Self-Assembled Monolayers of Silver Nanoparticles Firmly Grafted on Glass Surfaces: Low Ag+ Release for an Efficient Antibacterial Activity"; Journal of Colloid and Interface Science; 350 (2010) 110-116.

Phuong et al; "Structural Characterization of a Manganese Oxide Barrier Layer Formed by Chemical Vapor Deposition for Advanced Interconnects Application on SiOC Dielectric Substrates"; J. Phys. Chem. C; 117; pp. 160-164 (2013.

Ryu et al; "Impact of Near-Surface Thermal Stresses on Interfacial Reliability of Through-Silicon Vias for 3-D Interconnects"; IEEE Transactions on Device and Materials Reliability; 11 (1) pp. 35-43 (2011.

Shachman-Diamond et al; "30 Years of Electroless Plating for Semiconductor and Polymer Mirco-Systems"; Microelectronic Engineering; 132 (2015) pp. 35-45.

Shen et al; "Periodic Pulse Reverse Cu Plating for Through-Hole Filling" ECS Electrochem. Lett. 2013 vol. 2, Issue 5, D23-D25, 2013.

Shorey et al; "Advancements in Fabrication of Glass Interposers"; 2014 Electronic Components & Technology Conference; IEEE; pp. 20-25 (2014.

Shorey et al; "Progress and Application of Through Glass Via (TGV) Technolgy", Corning Incorporated; 6 Pages (2016.

(56) References Cited

OTHER PUBLICATIONS

Sukumaran; "Through-Package-Via Hole Formation, Metallization and Characterization for Ultra-Thin 3D Glass" 2014; Georgia Institute of Technology, A Dissertation; 201 Pages.

Takahashi et al; "Development of High Frequency Device Using Glass or Fused Silica With 3D Integration"; 67th Electornic Componsents and Technology Conference; IEEE; pp. 758-763 (2017.

Allvia, Allvia launches new product lines for Through Glass Vias (TGV) and Through Quartz Vias (TQV), google, 2016.

Benjamin et al; "The Adhesion of Evaporated Metal Films on Glass"; Proc. Roy. Soc. A., vol. 261, (1962); pp. 516-531.

Borghi et al; "M2 Factor of Bessel-Gauss Beams"; Optics Letters; vol. 22, No. 5; (1997) pp. 262-264.

Chen et al. "Development of an AOI system for chips with a hole on backside based on a frame imager" Proc. of SPIE vol. 9903, 2016. 6 pgs.

Dow et al; "Through-Hole Filling by Copper Electroplating"; Journal of the Electrochemical Society, 155 (12) 0750-0757, (2008).

Iijima et al; "Resistivity Reduction by External Oxidation of Cu—Mn Alloy Films for Semiconductor Interconnect Application"; Journal of Vacuum Science & Technology B: Microelectronics and Nanometer Structures Processing, Measurement, and Phenomena, 27, 1963-1968 (2009.

International Search Report and Written Opinion of the International Searching Authority; PCT/US2020/014257; dated Apr. 15, 2020; 8 Pages; European Patent Office.

Invitation to Pay Additional Fees of the International Searching Authority; PCT/US2019/026342; dated Jul. 16, 2019; 14 Pages; European Patent Office.

Invitation to Pay Additional Fees of the International Searching Authority; PCT/US2019/057757; dated Mar. 2, 2020; 12 Pages; European Patent Office.

Kiyama et al; "Examination of Etching Agent and Etching Mechanism on Femtosecond Laser Microfabrication of Channels Inside Vitreous Silica Substrates"; J. Phys. Chem. C, 2009, 113, pp. 11560-11566.

Koike et al; "P-33: Cu—Mn Electrodes for a-Si TFT and Its Electrical Characteristics"; SID Symposium Digest of Technical Papers, 41:1, 1343-1346 (2010).

Koike et al; "Self-Forming Diffusion Barrier Layer in Cu—Mn Alloy Metallization"; Appl Phys. Lett. 87, 041911-1-041911-3 (2005).

Microchemicals, "Silicon Wafers, Quartz Wafers, Glass Wafers," Product Specifications: Brochure. 2014, 28 pgs.

Schott, Schott HermeS (Registered)—Hermetic Through Glass Vias (TGV), Jul. 2016 (Year: 2016).

Shorey; "Leveraging Glass for Advanced Packaging and IoT"; Apr. 21, 2016, Retrieved Form the Internet: URL:http://www.corning.com/media/worldwide/cdt/documents/iMAPs%20-%20Corning%20Overview%20-%204-21-16%20FINALpptx.pdf.

Siegman; "New Development in Laser Resonators"; SPIE, vol. 1227, Optical Resonators (1990) pp. 2-14.

Thiele; "Relation Between Catalytic Activity and Size of Particle"; Industrial and Engineering Chemistry, vol. 31, No. 7; (1939) pp. 916-920.

Topper et al; "3-D Thin Film Interposer Based on TGV (Through Glass Vias): An Alternative to Si-Interposer"; IEEE, Electronic Components and Technology Conference; 2010; pp. 66-73.

U.S. Appl. No. 62/846,059; Cai et al. "Silicate Glass Compositions Useful for the Efficient Production of Through Glass Vias", filed May 10, 2019, 43 pgs.

Wakayama et al. "Small size probe for inner profile measurement of pipes using optical fiber ring beam device" Proc. of SPIE vol. 8563, 2012. 7 pgs.

Wu et al, "A Study on Annealing Mechanisms With Different Manganese Contents in CuMn Alloy"; Journal of Alloys and Compounds, vol. 542, 2012, pp. 118-123.

Yun et al; "P-23:The Contact Properties and TFT Structures of A-IGZO TFTS Combined With Cu—Mn Alloy Electrodes"; SID Symposium Digest of Technical Papers 42:1, 1177-1180.

Zavyalov, "3D Hole Inspection Using Lens with High Field Curvature" Measurement Science Review, V. 15, No. 1, 2015. pp. 52-57.

Chao; "Reliability Study of Hermetic Wafer Level MEMS Packaging With Through-Wafer Interconnect"; Microsystem Technologies; 2009, vol. 15, pp. 677-686.

Anthony et al; "Microfabrication in Foturan Photosensitive Glass Using Focused Ion Beam"; Proceedings of the World Congress on Enbineering; vol. II; 2007; 6 Pages.

Lueck et al; "Through Glass Vias (TGV) and Aspects of Reliability"; 2015 IEEE Electronic Components and Technology Conference; pp. 672-677 2015.

Department of Defense, MIL-STD-750E, Nov. 2006 (Year: 2006).

ESPEC Corp., The Concept of Relative Humidity in HAST, Feb. 2013, <https://www.test-navi.com/eng/research/handbook/pdf/07_TheConceptOfRelativeHumidityInHAST.pdf> (Year: 2013).

Schott, "MEMS Tightly Sealed with Schott HermeS (Trademark)", Jan. 2010, Tech Buzz: Electronic Packaging, Issue 2, <https://www.schott.com/d/epackaging/8e070fc9-4009-40c2-bca7-323542ee3a15/1.4/schott_tech_buzzJan_2010.pdf> (Year: 2010).

TJ Green Associates, "Hermetic vs "Near Hermetic" Packagingi A Technical Review", Sep. 2016, <https://www.tjgreenllc.com/2016/09/21/hermetic-vs-near-hermetic-packaging-a-technical-review/> (Year: 2016).

University of Maryland, Temperature Humidity Bias, Jun. 2008, <https://calce.umd.edu/temperature-humidity-bias> (Year: 2008).

Bush, Glass seals MEMS for harsh environments, Nov. 2014, Electronics Weekly, <https://www.electronicsweekly.com/news/business/manufacturing/glass-seals-mems-harsh-environments-2014-11/> (Year: 2014).

Chang et al., Communication—Defect-Free Filling of High Aspect Ratio Through Vias in Ultrathin Glass, Nov. 2018, Journal of Electrochemical Society, vol. 166, No. 1 (Year: 2018).

Fu et al., Adhesive enabling technology for directly plating copper onto glass/ceramic substrates, May 2014, 2014 IEEE 64th Electronic Components and Technology Conference (ECTC) (Year: 2014).

Keusseyan et al., Material and Process Developments for Robust and High Reliability Glass Wafers for 2.5D Packaging, Jan. 2015, Additional Conferences (Device Packaging, HiTEC, HiTEN, and CICMT) 2015 (Year: 2015).

Krohnert et al., Through Glass Vias for hermetically sealed High Frequency Application, Jan. 2019, Additional Conferences (Device Packaging, HiTEC, HiTEN, and CICMT) 2019 (Year: 2019).

Kuramochi et al., Glass Substrate with TGV(Thru Glass Via) Manufacturing Technology for Display Electronics, Jun. 2017, Society for Information Display Digest of Technical Papers, vol. 48, Issue 1, pp. 1201-1204 (Year: 2017).

Lee et al., Through-glass copper via using the glass reflow and seedless electroplating processes for wafer-level RF MEMS packaging, Jun. 2013, Journal of Micromechanics and Microengineering, vol. 23, No. 8 (Year: 2013).

Li et al., Fabrication of high-density electrical feed-throughs by deep-reactive-ion etching of Pyrex glass, Dec. 2002, Journal of Microelectromechanical Systems, vol. 11, Issue 6, pp. 625-630 (Year: 2002).

Liu et al., Failure analysis of through-silicon vias in free-standing wafer under thermal-shock test, Jan. 2013, Microelectronics Reliability, vol. 53, Issue 1, pp. 70-78 (Year: 2013).

Mobley et al., High-reliability via interconnections in glass wafers for2.5D packaging, Oct. 2014, Chip Scale Review, vol. 18, No. 5, pp. 36-38 (Year: 2014).

Ogutu et al., Superconformal Filling of Through Vias in Glass Interposers, Jun. 2014, ECS Electrochemistry Letters, vol. 3, No. 8 ( Year: 2014).

Shah et al., Low-Loss, High-Linearity RF Interposers Enabled by Through Glass Vias, Nov. 2018, IEEE Microwave and Wireless Components Letters, vol. 28, Issue 11, pp. 960-962 (Year: 2018).

(56) References Cited

OTHER PUBLICATIONS

Shorey et al., "Advancements in Fabrication of Glass Interposers", Electronic Components & Technology Conference, 2014, pp. 6.

Sukumaran et al., Low-Cost Thin Glass Interposers as a Superior Alternative to Silicon and Organic Interposers for Packaging of 3-D ICs, Sep. 2012, IEEE Transactions on Components, Packaging and Manufacturing Technology, vol. 2, Issue 9, pp. 1426-1433 (Year: 2012).

Takahashi et al., "Development of High Frequency Device using Glass or Fused Silica with 3D Integration," Electronics Components and Technology Conference, 2017, pp. 758-763.

Takahashi et al., Development of Through Glass Via (TGV) formation technology using electrical discharging for 2.5/3D integrated packaging, May 2013, 2013 IEEE 63rd Electronic Components and Technology Conference (Year: 2013).

Topper et al., 3-D Thin Film Interposer Based on TGV (Through Glass Vias): An Alternative to Si-Interposer, Jun. 2010, 2010 Proceedings 60th Electronic Components and Technology Conference (ECTC) (Year: 2010).

Woehrmann et al., Glass based interposers for RF applications up to 100GHz, Sep. 2016, 2016 6th Electronic System-Integration Technology Conference (ESTC) (Year: 2016).

\* cited by examiner

HERMETIC METALLIZED VIA WITH IMPROVED RELIABILITY

This application claims the benefit of priority to U.S. Provisional Application Ser. No. 62/801,408 filed on Feb. 5, 2019 and is a continuation and claims the benefit of priority to U.S. application Ser. No. 16/376,467 filed on Apr. 5, 2019, which claims priority to U.S. Provisional Application Ser. No. 62/654,869 filed on Apr. 9, 2018, U.S. Provisional Application Ser. No. 62/801,408 filed on Feb. 5, 2019, and U.S. Provisional Application Ser. No. 62/808,566 filed on Feb. 21, 2019. The contents of which are relied upon and incorporated herein by reference in their entirety.

FIELD

The present specification generally relates to vias in glass and glass ceramic substrates and, more particular, to hermetically sealed metallized vias in glass and glass ceramic substrates.

BACKGROUND

Glass and glass ceramic substrates with vias are desirable for many applications, including for use as in interposers used as electrical interfaces, RF filters, and RF switches. Glass substrates have become an attractive alternative to silicon and fiber reinforced polymers for such applications.

It is desirable to fill such vias with a conductor. Copper is presently the most desirable material for such conductors. However, copper does not adhere well to glass. In particular, a hermetic seal between copper and glass is desired for some applications. Such a seal is difficult to obtain because copper does not adhere well to glass, and because of a large mismatch in the coefficients of thermal expansion of many conductor materials, such as copper, and many desirable glass and glass ceramic substrate compositions. Additionally, when copper is adhered to the glass, the large mismatch in the coefficient of thermal expansions of the copper and the glass can result in the formation of radial and/or circumferential cracking of the glass when the glass article is subjected to high temperature processing. In particular, when the glass article is cooled from high temperatures, the copper contracts more quickly than the glass, and pulls the glass to which it is adhered, leading to stress buildup and formation of circumferential cracks due to the high stress buildup.

Accordingly, a need exists for alternative methods for metallizing through-glass vias that are hermetically sealed.

SUMMARY

According to a first aspect, an article comprises a glass or glass-ceramic substrate having a first major surface and a second major surface opposite the first major surface, and a via extending through the substrate from the first major surface to the second major surface over an axial length in an axial direction, the via defining an interior surface; and a first axial portion, a third axial portion, and a second axial portion disposed between the first axial portion and the third axial portion along the axial direction. The article further comprises a helium hermetic adhesion layer disposed on the interior surface; and a metal connector disposed within the via, wherein the metal connector is adhered to the helium hermetic adhesion layer, wherein: the metal connector coats the interior surface of the via along the axial length of the via to define a first cavity from the first major surface to a first cavity length, the metal connector comprising a coating thickness of less than 12 µm at the first major surface; the metal connector coats the interior surface of the via along the axial length of the via to define a second cavity from the second major surface to a second cavity length, the metal connector comprising a coating thickness of less than 12 µm at the second major surface; and the metal connector fully fills the via between the first cavity and the second cavity.

According to a second aspect, the glass article comprises the glass article of the first aspect, wherein the metal connector comprises an average coating thickness of less than 12 µm in the first axial portion and the third axial portion.

According to a third aspect, the glass article comprises the glass article of the first or second aspect, wherein the coating thickness within the via at the first major surface and the coating thickness within the via at the second major surface are each less than a coating thickness in the second axial portion.

According to a fourth aspect, the glass article comprises the glass article of any preceding aspect, wherein the first cavity length and the second cavity length are each greater than or equal to 3% of the axial length of the via and less than or equal to 97% of the axial length of the via.

According to a fifth aspect, the glass article comprises the glass article of any preceding aspect, wherein the via has a first diameter at the first major surface, a second diameter at the second major surface, and a third diameter in the second axial portion, and wherein the third diameter is less than the first diameter and the second diameter.

According to a sixth aspect, the glass article comprises the glass article of the fifth aspect, wherein the first diameter and the second diameter are each greater than or equal to 30 µm and less than or equal to 80 µm.

According to a seventh aspect, the glass article comprises the glass article of the sixth aspect, wherein the first diameter and the second diameter are each greater than or equal to 40 µm and less than or equal to 60 µm.

According to an eighth aspect, the glass article comprises the glass article of the seventh aspect, wherein the first diameter and the second diameter are each greater than or equal to 45 µm and less than or equal to 55 µm.

According to a ninth aspect, the glass article comprises the glass article of any of the fifth through eighth aspects, wherein the third diameter is greater than or equal to 10 µm and less than or equal to 40 µm.

According to a tenth aspect, the glass article comprises the glass article of the ninth aspect, wherein the third diameter is greater than or equal to 20 µm and less than or equal to 30 µm.

According to an eleventh aspect, the glass article comprises the glass article of the tenth aspect, wherein the third diameter is greater than or equal to 22 µm and less than or equal to 27 µm.

According to a twelfth aspect, the glass article comprises the glass article of any of the fifth through eleventh aspects, wherein a ratio of the third diameter to the first diameter and a ratio of the third diameter to the second diameter is less than or equal to 1:6.

According to a thirteenth aspect, the glass article comprises the glass article of any of the fifth through twelfth aspects, wherein the coating thickness within the via at the first major surface and the coating thickness within the via at the second major surface are each less than one half of the third diameter.

According to a fourteenth aspect, the glass article comprises the glass article of any preceding aspect, wherein the helium hermetic adhesion layer is disposed on the interior surface in the first axial portion and the third axial portion, and wherein the helium hermetic adhesion layer is not disposed on the interior surface in the second axial portion.

According to a fifteenth aspect, the glass article comprises the glass article of the fifteenth aspect, wherein the helium hermetic adhesion layer is disposed along an entire perimeter of at least one of the first axial portion and the third axial portion.

According to a sixteenth aspect, the glass article comprises the glass article of any preceding aspect, wherein the helium hermetic adhesion layer comprises one or more of Ti, Cr, TiN, Ni, Ta, W, and a metal oxide.

According to a seventeenth aspect, the glass article comprises the glass article of any preceding aspect, wherein the helium hermetic adhesion layer has a thickness of greater than or equal to 1 nm and less than or equal to 500 nm.

According to an eighteenth aspect, the glass article comprises the glass article of any preceding aspect, wherein the metal connector consists essentially of copper.

According to a nineteenth aspect, the glass article comprises the glass article of any preceding aspect, wherein the metal connector hermetically seals the via.

According to a twentieth aspect, the glass article comprises the glass article of any preceding aspect, wherein at least one of the first cavity and the second cavity is filled with one or more materials that are not copper.

According to a twenty-first aspect, the glass article comprises the glass article of any preceding aspect, wherein the article is free of cracks and has a helium permeability of less than $10^{-5}$ atm*cc/s before and after being heated to a temperature of 450° C. and cooled to a temperature of 23° C.

According to a twenty-second aspect, the glass article comprises the glass article of any preceding aspect, wherein the substrate comprises at least 90 wt % silica.

According to a twenty-third aspect, a method of fabricating a glass article comprises depositing a helium hermetic adhesion layer on portions of an interior surface of a via extending through a glass or glass-ceramic substrate, the substrate having a first major surface and a second major surface opposite the first major surface with the via extending through the substrate from the first major surface to the second major surface in an axial direction, the via comprising a first axial portion, a third axial portion, and a second axial portion disposed between the first axial portion and the third axial portion, wherein the helium hermetic adhesion layer is deposited on the interior surface of the via; depositing a metal connector on the first, second, and third axial portions of the via with an electroplating bath comprising a metal salt and a metal deposition inhibitor, wherein: the metal connector is adhered to the helium hermetic adhesion layer; the metal connector coats the interior surface of the via along the axial length of the via to define a first cavity from the first major surface to a first cavity length, with a coating thickness of less than 12 µm at the first major surface; the metal connector coats the interior surface of the via along the axial length of the via to define a second cavity from the second major surface to a second cavity length, with a coating thickness of less than 12 µm at the second major surface; and the metal connector fully fills the via between the first cavity and the second cavity.

According to a twenty-fourth aspect, the method comprises the method of the twenty-third aspect, wherein a plating rate of the metal connector is higher in the second axial portion than in the first axial portion and the third axial portion.

According to a twenty-fifth aspect, the method comprises the method of the twenty-third or twenty-fourth aspects, wherein the metal salt comprises a copper salt.

According to a twenty-sixth aspect, the method comprises the method of any of the twenty-third through twenty-fifth aspects, wherein depositing the metal connector comprises applying a current at a current density of greater than or equal to 1.5 mA/cm$^2$ and less than or equal to 5 mA/cm$^2$.

According to a twenty-seventh aspect, the method comprises the method of any of the twenty-third through twenty-sixth aspects, wherein the metal deposition inhibitor comprises nitroblue tetrazolium chloride (NTBC), methylthiazole tetrazolium (MTT), or tetranitroblue tetrazolium chloride (TNBT).

According to a twenty-eighth aspect, the method comprises the method of any of the twenty-third through twenty-seventh aspects, and further comprises filling at least one of the first cavity and the second cavity with one or more materials that are not copper.

According to a twenty-ninth aspect, the method comprises the method of any of the twenty-third through twenty-eighth aspects, wherein the helium hermetic adhesion layer is deposited on the interior surface of the via in the first axial portion and the third axial portion and the helium hermetic adhesion layer is not disposed on the interior surface of the via in the second axial portion.

DETAILED DESCRIPTION

Figure 1:
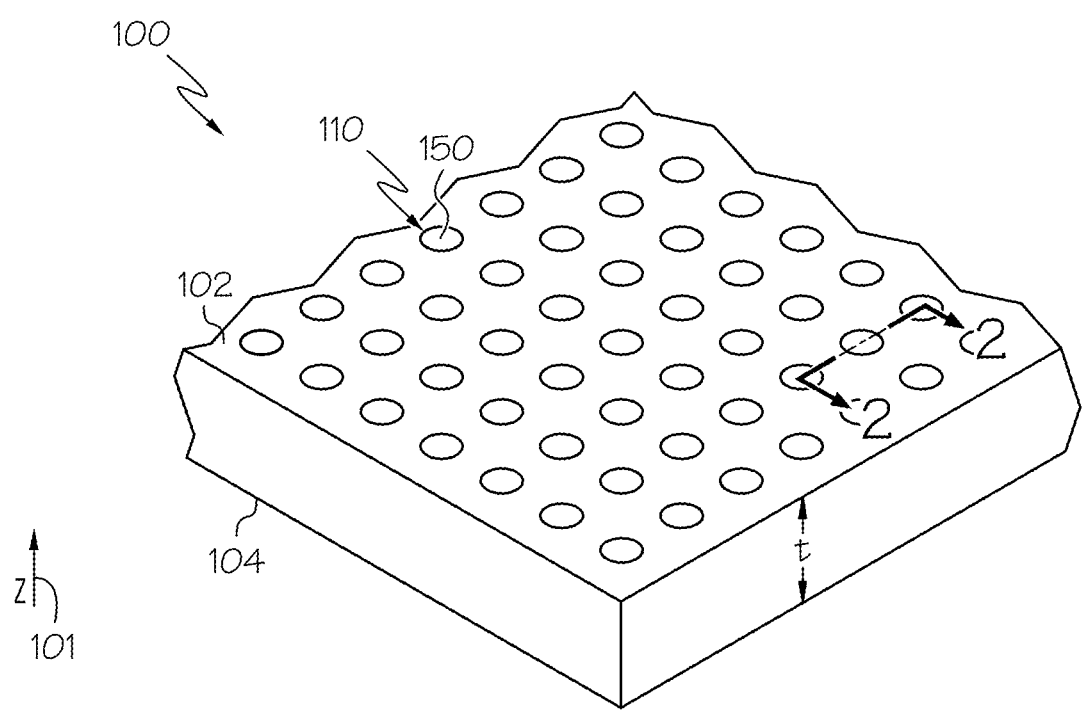
FIG. 1 shows a perspective view of a substrate with vias.

Unless otherwise expressly stated, it is in no way intended that any method set forth herein be construed as requiring that its steps be performed in a specific order, nor that with any apparatus specific orientations be required. Accordingly, where a method claim does not actually recite an order to be followed by its steps, or that any apparatus claim does not actually recite an order or orientation to individual components, or it is not otherwise specifically stated in the claims or description that the steps are to be limited to a specific order, or that a specific order or orientation to components of an apparatus is not recited, it is in no way intended that an order or orientation be inferred, in any respect. This holds for any possible non-express basis for interpretation, including: matters of logic with respect to arrangement of steps, operational flow, order of components, or orientation of components; plain meaning derived from grammatical organization or punctuation, and; the number or type of embodiments described in the specification.

As used herein, the singular forms "a," "an" and "the" include plural referents unless the context clearly dictates otherwise. Thus, for example, reference to "a" component includes aspects having two or more such components, unless the context clearly indicates otherwise. Also, the word "or" when used without a preceding "either" (or other similar language indicating that "or" is unequivocally meant to be exclusive—e.g., only one of x or y, etc.) shall be interpreted to be inclusive (e.g., "x or y" means one or both x or y).

The term "and/or" shall also be interpreted to be inclusive (e.g., "x and/or y" means one or both x or y). In situations where "and/or" or "or" are used as a conjunction for a group of three or more items, the group should be interpreted to include one item alone, all the items together, or any combination or number of the items. Moreover, terms used in the specification and claims such as have, having, include, and including should be construed to be synonymous with the terms comprise and comprising.

As used herein, the term "about" means that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art. When the term "about" is used in describing a value or an end-point of a range, the disclosure should be understood to include the specific value or end-point referred to. Whether or not a numerical value or end-point of a range in the specification recites "about," the numerical value or end-point of a range is intended to include two embodiments: one modified by "about," and one not modified by "about." It will be further understood that the end-points of each of the ranges are significant both in relation to the other end-point, and independently of the other end-point.

All disclosed ranges are to be understood to encompass and provide support for claims that recite any and all subranges or any and all individual values subsumed by each range. For example, a stated range of 1 to 10 should be considered to include and provide support for claims that recite any and all subranges or individual values that are between and/or inclusive of the minimum value of 1 and the maximum value of 10; that is, all subranges beginning with a minimum value of 1 or more and ending with a maximum value of 10 or less (e.g., 5.5 to 10, 2.34 to 3.56, and so forth) or any values from 1 to 10 (e.g., 3, 5.8, 9.9994, and so forth).

Glass and Glass Ceramic Substrates with Vias

Glass and glass ceramic substrates with vias are desirable for a number of applications. For example, 3D interposers with through package via (TPV) interconnects that connect the logic device on one side of the interposer and memory on the other side of the interposer are desirable for high bandwidth devices. The current substrate of choice is organic or silicon. Organic interposers suffer from poor dimensional stability while silicon wafers are expensive and suffer from high dielectric losses. Glass and glass ceramics may be superior substrate materials due to their relatively low dielectric constants, thermal stability, and low cost. There are applications for glass or glass ceramic substrates with through glass vias (TGV). These vias typically need to be fully or conformally filled by conducting metals such as copper to form a metal connector that provides an electrical pathway. Copper is a particularly desirable conducting metal.

FIG. 1 shows an article comprising a substrate 100, schematically depicted in a partial perspective view. Substrate 100 comprises a first major surface 102 and a second major surface 104 opposite first major surface 102. A plurality of vias 110 extend through the bulk of the substrate 100 from the first major surface 102 to the second major surface 104. Metal connectors 150 fill vias 110. It should be understood that any number of vias 110 may extend through substrate 100 in any arrangement. Coordinate marker 101 shows the direction of the axial dimension z, which is normal to the plane of the first major surface 102 and the second major surface 104. Unless otherwise specified, the "length" of a via or metal connector is in the axial dimension z. The thickness t of substrate 100, which is in the axial dimension, may be any appropriate thickness depending on the application.

In various embodiments, the substrate 100 may comprise any suitable glass or glass ceramic substrate. In some particular embodiments, high silica glass or glass ceramic substrates are desirable for certain applications due to their dielectric properties. For example, a glass or glass ceramic material having a silica content of 50 mol %, 55 mol %, 60 mol %, 65 mol %, 70 mol %, 75 mol %, 80 mol %, 85 mol %, 90 mol %, 95 mol %, or 100 mol %, or any range having any two of these values as endpoints, including endpoints, may be used. A glass or glass ceramic material having a silica content of 50 mol % to 100 mol %, or 75 mol % to 100 mol % may be used. In some embodiments, the substrate comprises at least 90 wt % silica.

For substrates having the dimensions described herein, it is particularly difficult to achieve a hermetically sealed via in high silica glass with copper metal connectors for at least two reasons. First, copper does not adhere well to glass. Second, the CTE mismatch between copper and high silica glass is particularly large. The articles and methods described herein achieve a hermetic seal notwithstanding these reasons by providing a superior stress relief mechanism.

Figure 2:
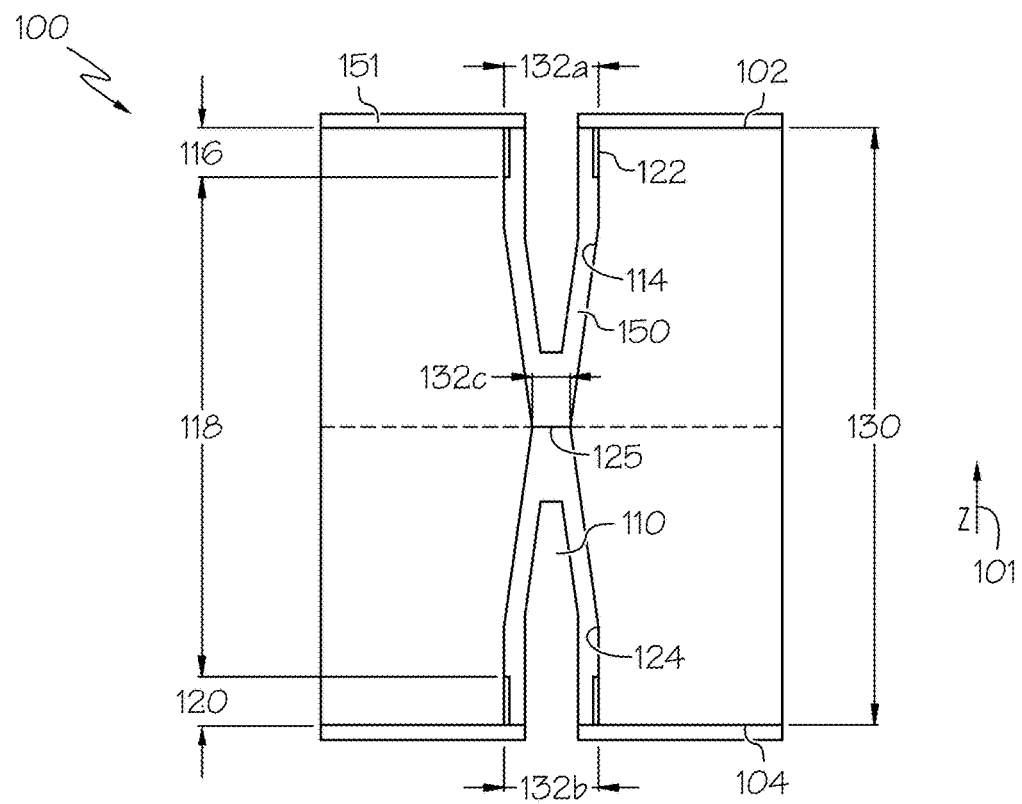
FIG. 2 shows a cross section of a via, taken along line 2-2' of FIG. 1.

FIG. 2 shows an article comprising the substrate 100, schematically depicted as a cross section of FIG. 1 along line 2-2'. FIG. 2 shows the substrate 100, the coordinate marker 101, the first major surface 102, the second major surface 104, the via 110 and the metal connector 150 of FIG. 1. The interior surface 114 of the via 110 is divided into a first axial portion 116, a second axial portion 118 and a third axial portion 120. A helium hermetic adhesion layer 122 is disposed on the interior surface 114 of the via 110 in the first axial portion 116 and the third axial portion 120. In embodiments, the helium hermetic adhesion layer 122 is disposed on the interior surface 114 of the via 110 along an entire perimeter of at least one of the first axial portion 116 and the third axial portion 120. The helium hermetic adhesion layer 122 is not present in the second axial portion 118.

The phrase "helium hermetic adhesion layer," as used herein, means an adhesion layer that provides hermeticity to helium at a permeability of less than $10^{-5}$ atm*cc/s, or even less than $10^{-8}$ atm*cc/s as measured using a vacuum-based helium leak testing system by adhering the metal connector 150 to the interior surface 114 of the via 110. Suitable helium hermetic adhesion layer materials include metals, like titanium (Ti), chrome (Cr), tantalum (Ta), vanadium (V), nickel (Ni), tungsten (W), or metal oxides, like titanium oxide, tungsten oxide, and manganese oxide, or nitrides, like titanium nitride (TiN) and tantalum nitride (TaN). In various embodiments, the helium hermetic adhesion layer comprises titanium (Ti). The helium hermetic adhesion layer has a thickness of greater than or equal to 1 nm and less than or equal to 500 nm. For example, in some particular embodiments, the helium hermetic adhesion layer has a thickness of about 100 nm.

In some embodiments, such as embodiments that are partially bonded, the axial length of the first axial portion 116 or the third axial portion 120 may be referred to as the "adhesion length," because it is the length into the via 110 along which the metal connector 150 adheres strongly to the substrate 100. In some such embodiments, the adhesion length is greater than or equal to 5 µm and less than or equal to 148 µm. The adhesion length may be greater than or equal to 10 µm and less than or equal to 135 µm, greater than or equal to 10 µm and less than or equal to 130 µm, greater than or equal to 10 µm and less than or equal to 125 µm, greater than or equal to 10 µm and less than or equal to 120 µm, greater than or equal to 10 µm and less than or equal to 115 µm, greater than or equal to 15 µm and less than or equal to 140 µm, greater than or equal to 15 µm and less than or equal to 135 µm, greater than or equal to 15 µm and less than or equal to 130 µm, greater than or equal to 15 µm and less than or equal to 125 µm, greater than or equal to 15 µm and less than or equal to 120 µm, greater than or equal to 20 µm and less than or equal to 140 µm, greater than or equal to 20 µm and less than or equal to 135 µm, greater than or equal to 20 µm and less than or equal to 130 µm, greater than or equal to 20 µm and less than or equal to 125 µm, greater than or equal to 25 µm and less than or equal to 140 µm, greater than or equal to 25 µm and less than or equal to 135 µm, greater than or equal to 25 µm and less than or equal to 130 µm, greater than or equal to 130 µm and less than or equal to 140 µm, greater than or equal to 30 µm and less than or equal to 35 µm, or greater than or equal to 35 µm and less than or equal to 140 µm. In some embodiments, the adhesion length is greater than or equal to 40 µm and less than or equal to 140 µm, greater than or equal to 40 µm and less than or equal to 130 µm, greater than or equal to 40 µm and less than or equal to 120 µm, greater than or equal to 40 µm and less than or equal to 110 µm, greater than or equal to 40 µm and less than or equal to 100 µm, greater than or equal to 40 µm and less than or equal to 90 µm, greater than or equal to 40 µm and less than or equal to 80 µm, greater than or equal to 40 µm and less than or equal to 70 µm, or greater than or equal to 40 µm and less than or equal to 60 µm. For example, the adhesion length may be about 40 µm, 50 µm, 60 µm or 70 µm. It is contemplated that other adhesion lengths may be employed in various embodiments.

In the second axial portion 118, the helium hermetic adhesion layer 122 is not present, so the metal connector 150 does not bond as strongly to the interior surface 114 along the second axial portion 118. The via 110 has a via length 130 in the axial direction. The via 110 has a first diameter 132a at the first major surface 102, a second diameter 132b at the second major surface 104, and a third diameter 132c in the second axial portion 118.

Via Shape

In the embodiments described herein, the via 110 has a tapered interior surface 114 that tapers or narrows from the first diameter 132a at the first major surface 102, and from the second diameter 132b at the second major surface 104, to a waist 125 having a waist diameter equal to the third diameter 132c. As used herein, the "waist" of a via refers to the part of a variable-diameter via having the smallest diameter. The diameter of the via 110 changes as a function of axial position. The overall "diameter" of the via 110 is the maximum diameter. Unless otherwise specified, "via diameter" refers to the maximum diameter. When the via 110 is not circular, the "diameter" of the via 110 is the diameter of a circle having the same cross-sectional area as the via 110, in a plane normal to the axial direction.

The via waist 125 has the smallest diameter along the axial length of the via. The diameter of the via waist as a percentage of the first diameter may be 10%, 15%, 20%, 25%, 30%, 35%, 40%, 45%, 50%, 55%, 60%, 65%, 70%, 75%, 80%, or any range having any two of these values as endpoints, including endpoints. The diameter of the via waist as a percentage of the second diameter may be 10%, 15%, 20%, 25%, 30%, 35%, 40%, 45%, 50%, 55%, 60%, 65%, 70%, 75%, 80%, or any range having any two of these values as endpoints, including endpoints. The diameter of the via waist may be 75% of the first diameter or less, and the diameter of the via waist may be 75% of the second diameter or less. The diameter of the via waist may be 20% to 50% of the first diameter or less, and the diameter of the via waist may be 20% to 50% of the second diameter or less. In various embodiments, the third diameter 132c, or the via waist, is greater than or equal to 10 µm and less than or equal to 40 µm. The third diameter 132c may be greater than or equal to 20 µm and less than or equal to 30 µm, or greater than or equal to 22 µm and less than or equal to 27 µm. For example, the third diameter 132c may be 10 µm, 15 µm, 20 µm, 22 µm, 25 µm, 27 µm, 30 µm, 35 µm, or 40 µm. In various embodiments, a ratio of the third diameter 132c to the first diameter 132a is less than or equal to 1:6, less than or equal to 1:5, less than or equal to 1:4, less than or equal to 1:3, or less than or equal to 1:2 and/or a ratio of the third diameter 132c to the second diameter 132b is less than or equal to 1:6, less than or equal to 1:5, less than or equal to 1:4, less than or equal to 1:3, or less than or equal to 1:2.

The via 110 may have any suitable via length 130. As non-limiting examples, the thicknesses of the substrate 100 (and the via length 130) may be 10 µm, 60 µm, 120 µm, 180 µm, 240 µm, 300 µm, 360 pm, 420 µm, 480 µm, 540 µm, 600 µm, 720 µm, 840 µm, 960 µm, 1080 µm, 1500 µm, 2000 µm, or any range having any two of these values as endpoints, including endpoints. In some embodiments, the thickness t and the via length is 10 µm to 2000 µm, 200 µm to 400 µm, or 240 µm to 360 µm.

The via 110 may have any suitable first diameter 132a and second diameter 132b. As non-limiting examples, these diameters may be 30 µm, 40 µm, 50 µm, 60 µm, 70 µm, 80 µm, or any range having any two of these values as endpoints, including endpoints. In some embodiments, the via diameter may be greater than or equal to 30 µm and less than or equal to 80 µm, greater than or equal to 40 µm and less than or equal to 60 µm, or greater than or equal to 45 µm and less than or equal to 55 µm. First diameter 132a may be the same as or different from second diameter 132b. As described hereinabove, the first diameter 132a and the second diameter 132b are each greater than the third diameter 132c.

The axial length of the first, second and third axial portions may be any suitable length. In various embodiments, lengths that achieve a combination of low maximum principal stress and helium hermeticity are selected. In some embodiments, the first and third axial portions have lengths that are independently chosen from 1%, 2%, 3%, 4%, 5%, 6%, 7%, 8%, 9%, 10%, 15%, 20%, 25%, 30%, 35% and 40% of the length of the via, or any range having any two of these values as endpoints, including endpoints. The second axial portion has a length that is 20%, 25%, 30%, 35%, 40%, 45%, 50%, 55%, 60%, 65%, 70%, 75%, 80%, 81%, 82%, 83%, 84%, 85%, 86%, 87%, 88%, 89%, 90%, 91%, 92%, 93%, 94%, 95%, 96%, 97%, or 98%, of the length of the via, or any range having any two of these values as endpoints, including endpoints. The first and third axial portions may have lengths that are 2% to 40% of the length of the via, while the second axial portion has a length that is 20% to 96% of the length of the via.

In various embodiments, the vias are high aspect ratio vias with a via length of 240 μm to 360 μm and a via diameter of 40 μm to 60 μm. As used herein, an "aspect ratio" refers to the ratio of the average thickness of the glass substrate to the average diameter of the vias. A "high aspect ratio" refers to aspect ratios of greater than 3. Without being bound by theory, for such vias, first and third axial portions having lengths of 20 μm, 25 μm, 30 μm, 35 μm and 40 μm, or any range having any two of these values as endpoints, including endpoints, may be desired to achieve a reduced stress, although other lengths are contemplated. The length of the second axial portion makes up the remainder of the via length.

In some embodiments, the first axial portion includes the intersection of the via with the first major surface, and the second axial portion includes the intersection of the via with the second major surface.

The via 110 optionally has rounded fillets 124 at interior edges to reduce stress concentration, including at the via waist 125. As used herein, "fillets" refers to a rounded corner along an interior corner of the via 110. Such rounded fillets may be used at any edge in a via shape. The rounded fillets 124 may have any suitable diameter, such as 3 mm, 4 mm, 5 mm, 6 mm, 7 mm, 8 mm, or any or any range having any two of these values as endpoints, including endpoints. Other diameters may be used.

The via 110 has an interior surface 114 with two distinct slopes, with a slope change at fillet 124. The via 110 may have a single slope from each of the first major surface 102 and the second major surface 104 to the waist 125, two slopes as illustrated in FIG. 2, or more complex shapes. One or more of the slopes may be perpendicular to the first major surface 102 and the second major surface 104, as illustrated in FIG. 2.

Metal Connector

Figure 3:
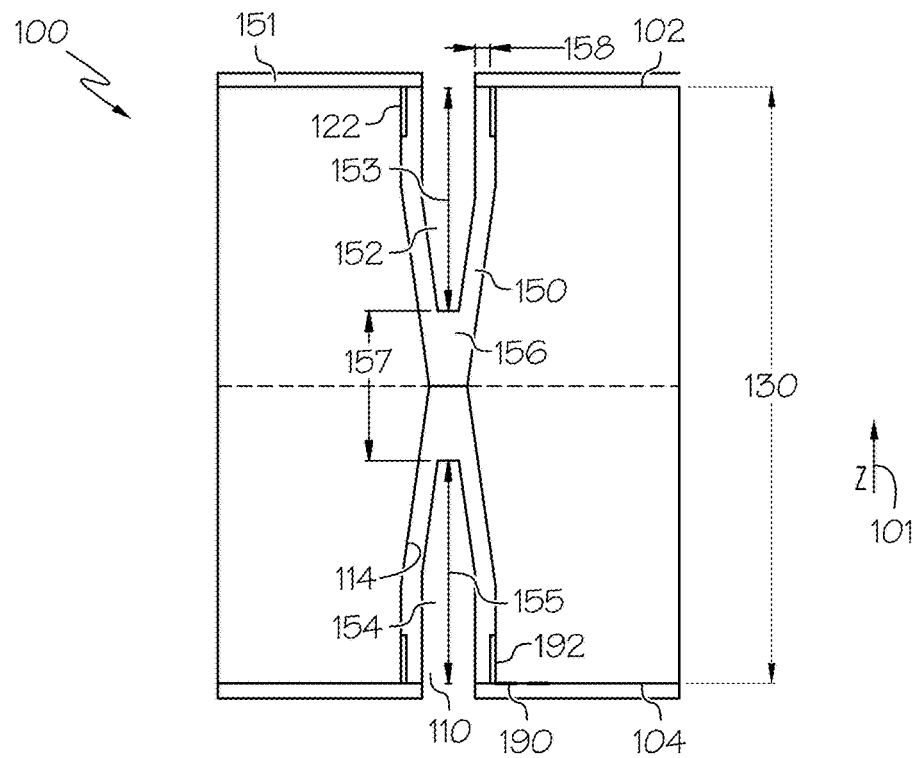
FIG. 3 shows the via of FIG. 2 a via with focus on the features of the metal connector.

FIG. 3 shows the same via 110 as FIG. 2, but is labeled to illustrate the parts of the metal connector 150. The metal connector 150 defines a first cavity 152 within the first axial portion 116 and a second cavity 154 within the third axial portion 120. The first cavity 152 is separated from the second cavity 154 by a filled portion 156 within the second axial portion 118. The first cavity 152 has a first cavity length 153 in the axial dimension, and the second cavity 154 has a second cavity length 155 in the axial dimension. At each position in the axial dimension along the first cavity length 153 and the second cavity length 155, the metal connector 150 coats the interior surface 114 without completely filling the via 110. The filled portion 156 has a filled length 157 in the axial dimension. The metal connector 150 has a coating thickness 158 along the first cavity length 153 and the second cavity length 155. Although illustrated as a constant thickness (a conformal layer), coating thickness 158 may vary with axial position and distance from the first major surface and/or second major surface.

In various embodiments, the metal connector 150 has a coating thickness 158 of less than 12 μm at the first major surface 102 and at the second major surface 104. For example, the metal connector 150 may have a coating thickness 158 of 5 μm, 6 μm, 7 μm, 8 μm, 9 μm, 10 μm, or 11 μm at the first major surface 102 and at the second major surface 104. In some embodiments, the metal connector 150 has an average coating thickness of less than 12 μm in the first axial portion and in the second axial portion. In some embodiments, the metal connector 150 has an average coating thickness of less than 12 μm over the length from the first major surface 102 to the adjacent rounded fillet 124 and over the length from the second major surface 104 to the adjacent rounded fillet 124.

The use of a via 110 with a tapered shape, i.e., a waist 125 with a diameter narrower than the first diameter 132a and the second diameter 132b, enables fabrication of metal connector 150 with the unique geometry shown in FIGS. 2 and 3. Specifically, that shape has the first cavity 152 and the second cavity 154 extending from the first major surface 102 and the second major surface 104, respectively. At the same time, the metal connector 150 includes a filled portion 156 in proximity to the waist 125. The geometry of the metal connector 150 allows for a hermetic seal to the substrate 100 with degrees of freedom for stress relief not available with other geometries. In particular, the helium hermetic adhesion layer 122 forms a hermetic seal between the metal connector 150 and the substrate 100 at the first major surface 102 and the second major surface 104, for the axial lengths of the first axial portion 116 and the third axial portion 120, respectively. The filled portion 156 completes the hermetic seal, such that gas and liquid cannot pass through the via 110 between the first major surface 102 and the second major surface 104. The lack of adhesion in the second axial portion 118 provides an extra degree of freedom for the metal connector 150 to relieve stress during thermal cycling. Additionally, the first cavity 152 and the second cavity 154 provide yet another degree of freedom for stress relief. These degrees of freedom for stress relief result in a metal connector that can survive thermal cycling without causing the substrate to fail due to the differential in the coefficients of thermal expansion between the metal connector and the substrate.

In some embodiments, the first cavity 152 and the second cavity 154 extend sufficiently far into the via 110 that they overlap with the second axial portion 118. This overlap results in axial portions of the metal connector 150 that are neither bonded to substrate 100 nor filled. Such a geometry provides further mechanisms for stress relief.

The first cavity length may be 3%, 5%, 10%, 15%, 20%, 25%, 30%, 35%, 40%, 45%, 50%, 60%, 70%, 80%, 90%, 95%, or 97% of the axial length of the via 110, or any range having any two of these values as endpoints, including endpoints. The second cavity length 155 may be 3%, 5%, 10%, 15%, 20%, 25%, 30%, 35%, 40%, 45%, 50%, 60%, 70%, 80%, 90%, 95%, or 97% of the axial length of the via 110, or any range having any two of these values as endpoints, including endpoints. The second cavity length 155 may be the same as or different from the first cavity length 153. In various embodiments, the first cavity length 153 and the second cavity length 155 are each greater than or equal to 10 μm and less than or equal to 150 μm. For example, the first cavity length 153 and the second cavity length 155 may each be 10 μm, 15 μm, 20 μm, 25 μm, 30 μm, 35 µm, 40 µm, 45 µm, 50 µm, 60 µm, 70 µm, 80 µm, 90 µm, 100 µm, 110 µm, 120 µm, 130 µm, 140 µm, 150 µm, or any range having any two of these values as endpoints, including endpoints.

The filled portion 156 has an axial length that makes up the difference between the axial via length 130 on one hand, and the first cavity length 153 and the second cavity length 155 on the other. In some embodiments, the metal conductor fully fills the via for at least 10% of the axial length of the via 110.

Along the axial length of the via where the first cavity 152 and the second cavity 154 are present, the coating thickness 158 is less than 50% of the via diameter at each point along the axial length. In various embodiments herein, the coating thickness 158 is measured as the thickness of the metal connector, and does not include the thickness of the helium hermetic adhesion layer. As a result, the coating thickness does not extend to the center of the via 110, such that the first cavity 152 and the second cavity 154 may be formed. The coating thickness 158 may be 5%, 10%, 15%, 20%, 25%, 30%, 35%, 40%, 45% or 49% of the via diameter at each point along the axial length, or any range having any two of these values as endpoints, including endpoints. The coating thickness 158 may be constant with the axial position, or may change with the axial position. The coating thickness 158 may be, along the axial length of the via where the first cavity 152 and the second cavity 154 are present, 1 µm, 2 µm, 3 µm, 4 µm, 5 µm, 6 µm, 8 µm, 10 µm, or less than 12 µm, or any range having any two of these values as endpoints, including endpoints, so long as the coating thickness 158 is sufficiently small to not completely fill the via where the first cavity 152 and the second cavity 154 are present. However, as will be described in greater detail below, the coating thickness 158 of various embodiments is less than 12 µm. In various embodiments, the coating thickness 158 within the via at the first major surface and the coating thickness 158 within the via at the second major surface are each less than the coating thickness in the second axial portion. In some embodiments, the coating thickness 158 is less than one half of the diameter of the third diameter 153c within the via at each of the first major surface 102 and the second major surface 104.

Although depicted in FIGS. 2 and 3 as being empty or unfilled, in some embodiments, the first cavity 152 and/or the second cavity 154 may be filled with one or more materials that are not copper. Such filling of the first cavity 152 and/or the second cavity 154 may reduce or eliminate contamination or degradation of the metal connector 150 as a result of corrosive materials used in processing of the glass article. In embodiments, the material may have a CTE that is lower than the CTE of the metal connector 150, have plasticity, and/or have one or more degrees of freedom beyond the degrees of freedom of the metal connector 150. In particular embodiments, the material may further reduce the stress of the glass article, or even result in a net zero stress of the glass article. In some embodiments, the material does not covalently bind the metal connector 150.

Suitable materials that may be used to fill the first cavity 152 and/or the second cavity 154 can include, by way of example and not limitation, materials that do not degrade at temperatures of greater than or equal to 400° C. or even 500° C. For example, sol gel silica, sol gel metal oxides, polymers, composites, alloys, or other types of inorganic materials may be used depending on the particular embodiment. The first cavity 152 and/or the second cavity 154 may be filled using any one of a variety of methods known and used in the art, including, but not limited to, inkjet printing, spray coating, or another deposition method. It is contemplated that the particular method for filling the first cavity 152 and/or the second cavity 154 may depend on the particular material to be used.

Fabrication Methods

Through-glass vias with a tapered shape may be fabricated by any suitable method. One method is to form a damage track in the substrate 100 with a laser, followed by etching. Exemplary methods are described in U.S. Pat. No. 9,656,909, and U.S. Patent Application Ser. No. 62/588,615, which are incorporated herein by reference in their entireties. Another method is to modify photosensitive glass with a laser, followed by etching.

Figure 4:
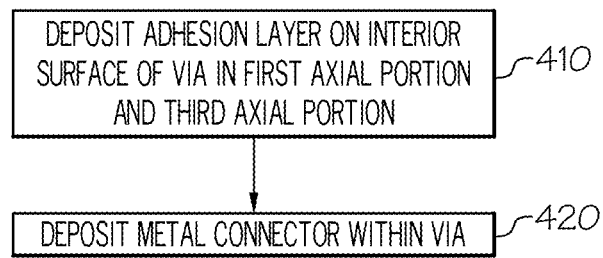
FIG. 4 shows a flowchart for a process of making a via.

FIG. 4 shows a flowchart illustrating a process for metallizing a through glass via. In a step 410, a helium hermetic adhesion layer is deposited on the interior surface of a via in the first axial portion and the third axial portion, but not the second axial portion. In a subsequent step 420, a metal connector is deposited within the via, such that the metal connector adheres to the helium hermetic adhesion layer in the first axial portion and the third axial portion.

The helium hermetic adhesion layer may be deposited on the interior surface in the first and the third axial portions, but not the second axial portion, by any suitable method. For example, the length of the first and third axial portions in the z dimension may be readily controlled using line of sight deposition methods such as sputtering, and adjusting the deposition angle. The substrate may be rotated during deposition to ensure that the length of the first and third axial portions are constant around the entire perimeter of the interior surface of the via in the first axial portion and the third axial portion.

Helium hermetic adhesion layers in the form of films formed from metals, metal oxides, or metal nitrides can be applied to the glass surface using many different methods, like sputtering, ebeam deposition, ion beam deposition, atomic layer deposition, chemical vapor deposition and solution coating.

The metal connector may be fabricated from any suitable metal. In some embodiments, copper may be a desirable metal due to its particularly high conductivity. Gold, silver, and other conductive metals may be used, as well as alloys of conductive metals. In embodiments, the metal connector comprises copper. In some particular embodiments, the metal connector consists essentially of copper.

The metal connector may be deposited by any suitable means. One suitable method for depositing copper (and other metals) is depositing a catalyst such as Pd on the helium hermetic adhesion layer, followed by electroless deposition of copper, followed by electroplating copper. In various embodiments, the electroplating process includes the use of an electroplating bath comprising a metal salt and a metal deposition inhibitor and application of a current at a current density of greater than or equal to 1.5 mA/cm$^2$ and less than or equal to 5 mA/cm$^2$, or greater than or equal to 1.5 mA/cm$^2$ and less than or equal to 2.5 mA/cm$^2$. The metal salt can be a salt of the metal forming the metal connector, such as $CuSO_4$. The metal deposition inhibitor may be selected to specifically inhibit or slow the plating rate of the metal at or near the first and second major surfaces, enabling the formation of a metal connector with a coating thickness that is thinner within the via at the first and second major surfaces than at the waist of the via.

One example of a metal deposition inhibitor is nitroblue tetrazolium chloride (NTBC). Without being bound by theory, it is believed that NTBC preferentially adsorbs on copper ions near the entrances to the vias, which leads to a suppression of copper deposition in the region where the NTBC has been adsorbed. The preferential adsorption of NTBC also leads to a concentration gradient of adsorbed NTBC along the axial length of the via, with more NTBC near the first and second major surfaces and very little NTBC near the waist of the via. Accordingly, copper may be deposited faster near the waist of the via as compared to near and on the first and second major surfaces. Therefore, by maintaining the differential plating rate, the via center may be plugged while the coating thickness at the first and second major surfaces is less than one half of the diameter of the waist.

Although various embodiments described herein include NTBC as a metal deposition inhibitor, other metal deposition inhibitors and methods for achieving and maintaining a differential plating rate are contemplated. For example, Ni—B (NTB), methylthiazole tetrazolium (MTT), and/or tetranitroblue tetrazolium chloride (TNBT) may be used as metal deposition inhibitors.

Other suitable methods for depositing the metal connector include filling the via with metal paste and sintering or chemical vapor deposition (CVD). Suitable methods for depositing copper are further described in US Patent Publication US 2017-0287728 (see, for example, paragraphs [0004]-[0005], which is incorporated by reference in its entirety.

Thermal Cycling

Glass and glass ceramic substrates with filled vias are often subject to thermal cycling. This thermal cycling may occur during device operation, or during fabrication steps subsequent to via filling. In some embodiments, for example, the glass substrate may be subjected to thermal cycling for annealing.

As described above, there is a large mismatch between the coefficient of thermal expansion (CTE) of copper and other metals, and the CTE of many glass and glass ceramic materials. Because of the CTE mismatch, upon heating, the metal connector expands more quickly than the surrounding glass or glass ceramic substrate. Similarly, upon cooling, the metal connector contracts more quickly than the surrounding substrate. This difference in expansion and contraction causes stress which can lead to a number of failure mechanisms, such as delamination or cracking. These failure mechanisms can cause loss of hermeticity and other problems.

Delamination is one failure mechanism. Delamination occurs when a conductive metal, such as copper, detaches from the interior of a via. When there is a weak bond between the conductor and the substrate, the stress caused by thermal cycling can lead to delamination. Delamination can lead to loss of hermeticity, as gas and liquid may penetrate the substrate along the boundary between the delaminated metal connector and the interior surface of the via.

Delamination may be reduced or eliminated by forming a sufficiently strong bond between the substrate and the metal connector. The helium hermetic adhesion layer disposed on the interior surface of the via, between the substrate and the metal connector, may be used to form such a bond. As used herein, and "adhesion layer" refers to any layer or surface treatment that leads to a bond between the metal connector and the substrate sufficiently strong to survive thermal cycling from 25° C. to 450° C.

Although delamination may be prevented by forming a strong bond between the metal connector and substrate, this stronger bond prevents the metal connector from moving relative to the substrate during thermal cycling. As a result, thermal cycling may cause stress in the substrate that leads to cracking and loss of hermeticity.

The 2-D plane-strain solution to the classical Lame problem in elasticity to predict stress field in glass center is as follows:

$$\sigma_r^A = -\sigma_\theta^A = \frac{-E_f \varepsilon_T}{1 - 2v_f + \frac{1+v_m}{1+v_f}\frac{E_f}{E_m}} \left(\frac{D_f}{2r}\right)^2$$

where $\sigma_r$ and $\sigma_\theta$ are the radial and circumferential stresses, respectively, and $\varepsilon_T = (\alpha_f - \alpha_m)\Delta T$ is the mismatch strain due to a thermal load $\Delta T$. The material properties $\alpha$, E, and v are the CTE, Young's modulus, and Poisson's ratio, with the subscripts f and m for the via (fiber) and glass (matrix), respectively.

Failure can occur in as a result of both heating and cooling in thermal cycling. During heating, the greatest expansion mismatch is at the hottest temperatures. Much of the stress in the substrate is compressive at higher temperatures, because the metal connector has expanded more than the substrate. Circumferential stress around the metal connector, which is dominant during heating, can lead to radial cracking, which may propagate to adjacent vias. During cooling, the greatest shrinkage mismatch is at the lowest temperatures. Much of the stress in the substrate is tensile at lower temperatures, because the metal connector has shrunk more than the substrate. The radial stress, which is dominant during cooling, can lead to cracking. The radial stress is tensile in glass near the surface, which may cause circumferential cracking of the glass. For both heating and cooling, the presence of the shear stress along the interface can induce interfacial failure by delamination.

Toward the end of a cooling part of thermal cycling, the metal connector 150 has shrunk more than the substrate 100 due to the difference in CTE. Because the metal connector 150 is adhered to the substrate 100, the shrinkage of the metal connector 150 pulls on the substrate 100, placing the substrate 100 in tensile stress. Without sufficient degrees of freedom for stress relief, this tensile stress will cause microcracks in the substrate 100, which can in turn cause loss of hermeticity.

Various embodiments described herein may exhibit helium hermeticity and no cracking after being subjected to thermal cycling. In particular, in the various embodiments described herein, the presence of the conformal copper coating having a limited coating thickness at the major surfaces of the substrate and with a fully filled midsection, and the helium hermetic adhesion layer that is not present along the second axial portion of the via provides helium hermeticity while enabling the substrate and the metal connector to shrink at different rates without generating an amount of tensile stress sufficient to generate microcracks.

Modeling

For modeling, the geometry of FIGS. 2 and 3 was used, where the interior surface of the via is conformally coated with copper everywhere except for 75 μm of axial length, 37.5 μm on each side of waist 125, where the via is filled all the way through. Via length 130 was 300 μm. First diameter 132*a* and second diameter 132*b* were each 50 μm. The 50 μm diameter is maintained for a distance of 50 μm along the axial length from both surfaces. Starting at 50 μm from the surfaces, the via tapers inwards to a diameter of 20 μm at waist 125, halfway along the axial length. On both the top and bottom surfaces, a 20 μm thick, flat copper overburden 151 (shown in FIGS. 2 and 3) is included. It is expected that the modeling results will extent to other via and metal connector shapes having cavities in the metal connector and a second axial portion without strong bonding between the metal connector and substrate.

In one process flow for fabricating an actual device, the geometry of FIG. 2 and FIG. 3, including copper overburden 151, is present when the most severe thermal cycling occurs. Afterwards, the overburden is removed and further processing may occur. But, the geometry of FIG. 2 and FIG. 3 has relevance to the thermal cycling modeled herein.

The modeling was based on theories drawn from Ryu S K, Lu K H, Zhang X, Im J H, Ho P S, Huang R. Impact of near-surface thermal stresses on interfacial reliability of through-silicon vias for 3-D interconnects. IEEE Transactions on Device and Materials Reliability. 2011 March; 11(1):35-("Ryu"). According to Ryu, there is an analytical solution to predict via and wafer surface stresses when a via is placed in a wafer. But, there is no closed form to predict stresses through thickness. So, modeling is required. For modeling, a single isolated hole in finite plate is modeled. 2D axi-symmetry is assumed and small enough mesh size of ~0.5 um is used.

Figure 5A:
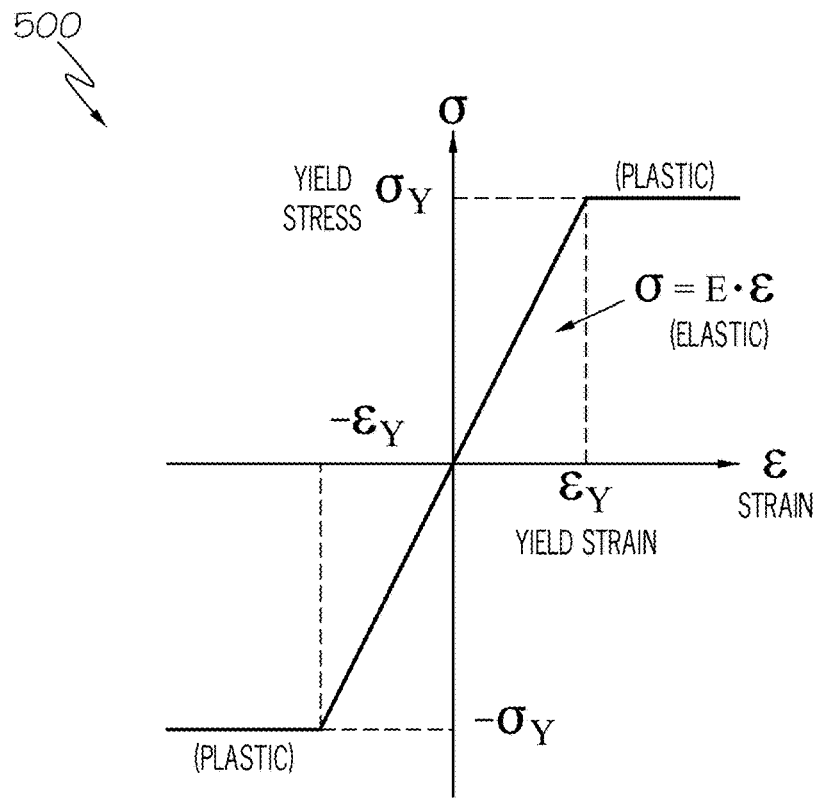
FIG. 5A shows the stress-strain relationship for an elastically perfect plastic model used in modeling.
Figure 5B:
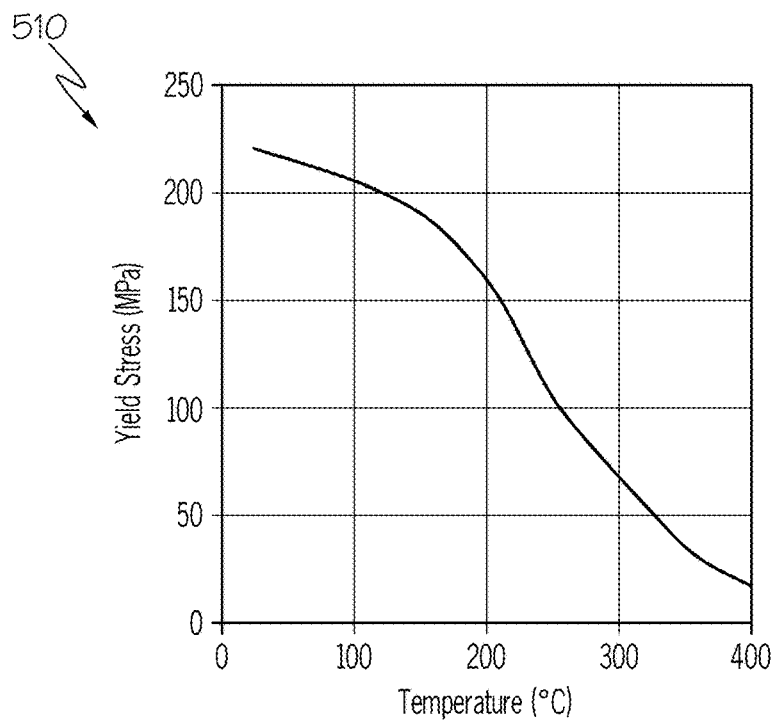
FIG. 5B shows the temperature dependent copper yield stress used in modeling.

For the modeling, it was assumed that the glass is elastic, with the properties of fused silica: E (Young's modulus)=73 GPa; v (Poisson's ratio)=0.17 and α (coefficient of thermal expansion)=0.55 ppm/° C. It was assumed that copper has elastically perfect plastic properties, with temperature dependent yield stresses. FIG. 5A shows graph 500, which illustrates the stress-strain relationship for an elastically perfect plastic material. FIG. 5B shows graph 510, which illustrates the temperature dependent copper yield stress. The elastic properties of copper used for the modeling were: E (Young's modulus)=121 GPa; v (Poisson's ratio)=0.35 and α (coefficient of thermal expansion)=17 ppm/° C. It was also assumed that the system including the copper via and fused silica was in a stress-free state at 25° C. The modeling calculated stresses after a thermal cycle from 25° C. to 400° C. and back down to 25° C.

If the glass cracks, it will crack first where the first principal stress is largest, i.e., the "maximum first principal stress." With reference to FIG. 3, modeling showed the highest first principal stress at two points. First, there was a high maximum principal stress on the surface of substrate 100 along line 190, a short distance from the interface between the helium hermetic adhesion layer 122 and the substrate 100. This first point of high stress corresponds to a failure mechanism observed in the samples, microcracks in the surface.

Figure 6:
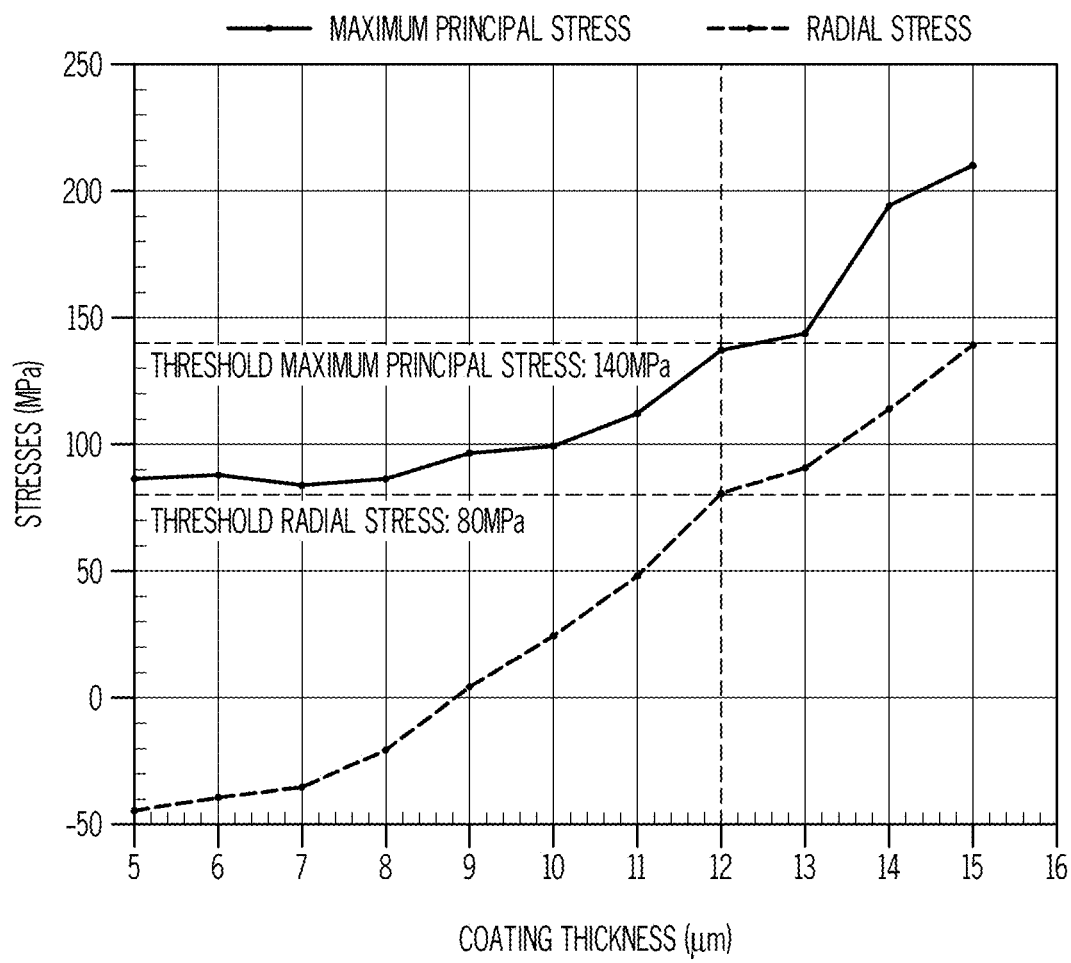
FIG. 6 shows a plot of the modeled first maximum principal stress and the modeled maximum radial stress (y-axis) for various copper coating thicknesses (x-axis)

Second, there was a maximum principal stress at point 192, where the helium hermetic adhesion layer 122 ends. This point is the dominant stress component to induce crack initiation and propagation. FIG. 6 shows a plot of modeled maximum first principal stress and maximum radial stress along line 190 for different copper wall thicknesses. As shown in FIG. 6, at a coating thickness of 12 μm, both the maximum first principal stress and maximum radial stress meet or exceed threshold values (140 MPa for maximum first principal stress and 80 MPa for maximum radial stress for the configurations depicted in FIGS. 2 and 3).

Figure 7:
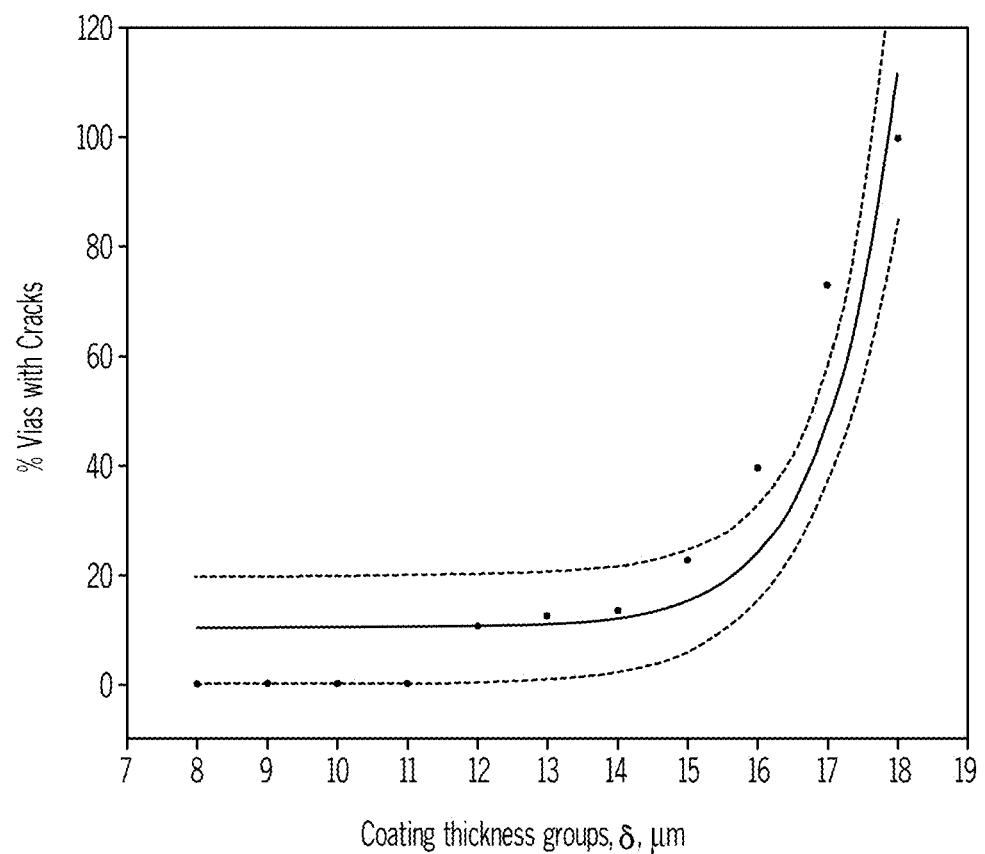
FIG. 7 shows a plot of the percentage of vias with cracks (y-axis) as a function of copper coating thickness (x-axis)

FIG. 7 shows a plot of the percentage of vias with cracks for different copper coating thicknesses after the wafer was annealed to a maximum temperature of 400° C., with the dashed lines representing 95% confidence boundaries for the regression fit. The coating thickness was measured at the first or second major surface, and groups were formed based on the integer of the coating thickness measurement. In other words, the group "8 μm" includes coating thicknesses of from 8.00 μm to 8.99 μm, the group "9 μm" includes coating thicknesses of from 9.00 μm to 9.99 μm, and so on. As shown in FIG. 7, cracking does not occur in vias until the coating thickness is greater than or equal to 12 μm. The modeling allows one of skill in the art to make informed choices about a metal connector parameter, in this case the coating thickness 158. The coating thickness should not be reduced too much, as some coating thickness is needed to form a hermetic seal, and to achieve the desired conductivity through the metal connector 150.

Figure 8A:
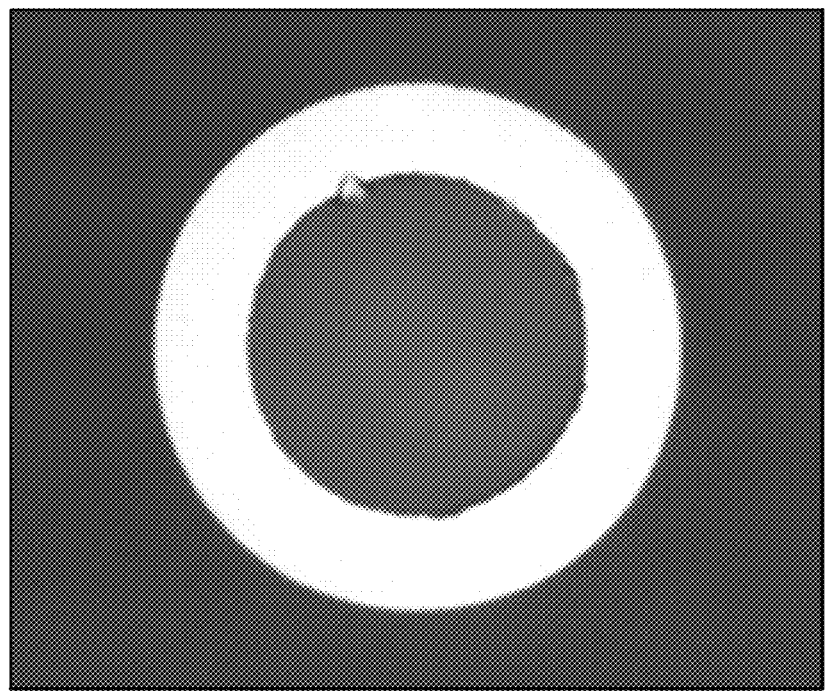
FIG. 8A shows an example via having a copper coating thickness of less than 12 µm and having no microcracks.
Figure 8B:
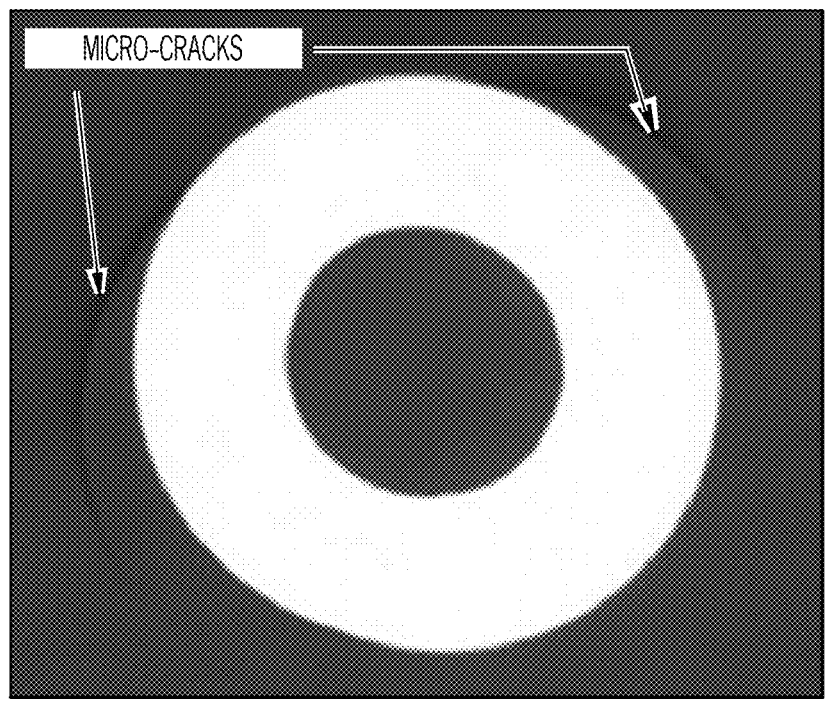
FIG. 8B shows an example via having a copper coating thickness of greater than or equal to 12 µm and exhibiting circumferential microcracks.

FIGS. 8A and 8B are cross-section images of metallized through-glass vias having different copper coating thicknesses. As shown in FIG. 8A, if the coating thickness of the copper is less than 12 μm, there are no cracks, whereas circumferential microcracks are shown in FIG. 8B, where the coating thickness of the copper is greater than or equal to 12 μm.

Example

As an example, a Ti/Cu was first deposited using sputtering as the sealant layer. Next, electroless Cu deposition was carried out to create a continuous seed layer. The TGV samples underwent SC1 cleaning process followed by application of a silane as the adhesion layer. The electroless copper deposition was carried out in a commercial "Uyemura electroless" bath using Pd/Sn colloid as the catalyst and formaldehyde as the reducing agent. The thickness of the seed layer was about 400 nm.

Figure 9:
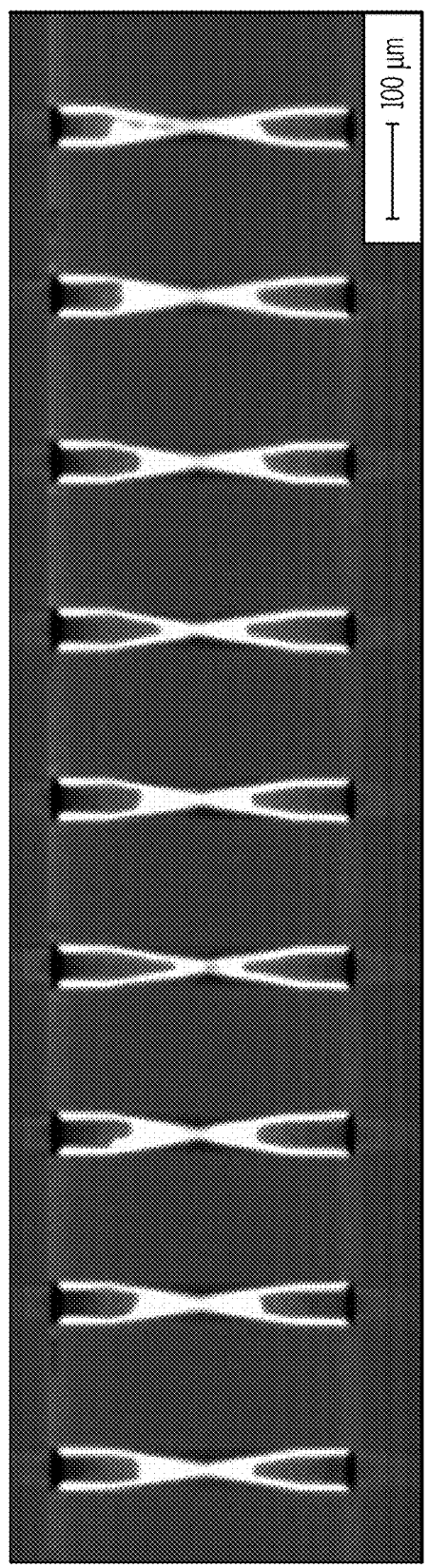
FIG. 9 is an X-ray CT scan of an example metallized TGV.
Figure 10A:
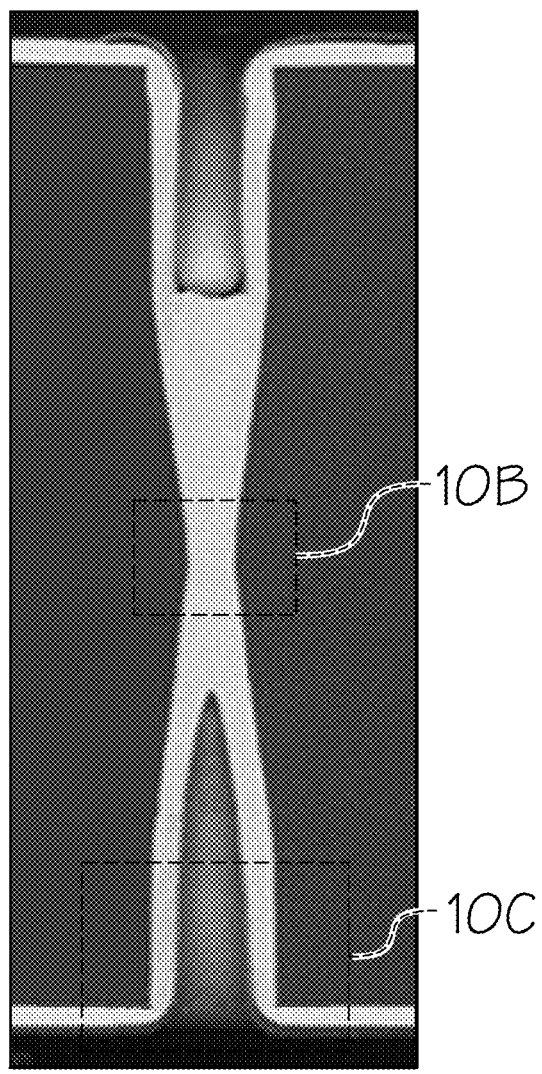
FIG. 10A depicts an SEM image of the example metallized TGV of FIG. 9 to validate the copper coating thickness profile.
Figure 10B:
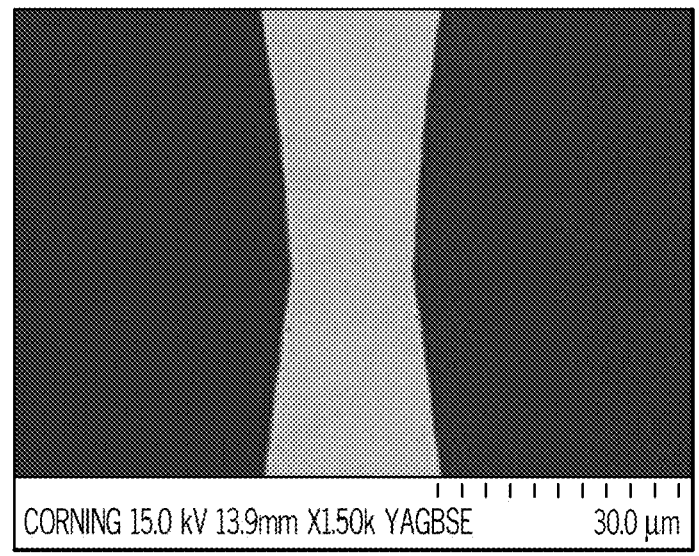
FIG. 10B depicts an SEM image of the waist of the example metallized TGV of FIG. 9 to validate the copper coating thickness profile.
Figure 10C:
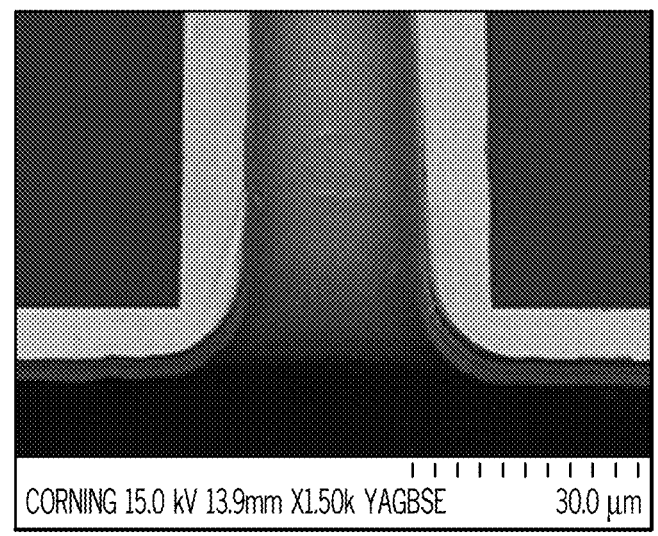
FIG. 10C depicts an SEM image of the entrance of the example metallized TGV of FIG. 9 to validate the copper coating thickness profile.

Following deposition of the seed layer, the TGV substrate was electroplated with Cu. First, a conformal plating of copper was carried out using a commercial Cupracid TP bath to ensure a good and uniform conductivity inside the vias. The thickness of the conformal plating layer was about 3 μm. Next, metallization using a NTBC additive bath was performed. The bath composition was 0.88 M $CuSO_4$, 45 ppm NTBC, 0.56 M $H_2SO_4$, and 45 ppm $Cl^-$ ions. The plating was done at a constant current density of 1.5 $mA/cm^2$. The X-ray CT scan of metallized TGVs with this process is shown in FIG. 9. All the TGVs are metallized with a structure that resemble the schematic of the inventive article in FIG. 2. In FIG. 10A-C, the SEM images which validate the plating thickness profile are provided. As shown in FIGS. 10A and 10B, it is evident that the center of the via is fully plugged with Cu while the coating thickness is about 8 μm (FIG. 10C).

Conclusion

As used here, the transitional phrase "consisting essentially of" limits the scope of a claim to the specified materials or steps "and those that do not materially affect the basic and novel characteristic(s)" of the claimed invention.

Those skilled in the relevant art will recognize and appreciate that many changes can be made to the various embodiments described herein, while still obtaining the beneficial results. It will also be apparent that some of the desired benefits of the present embodiments can be obtained by selecting some of the features without utilizing other features. Accordingly, those who work in the art will recognize that many modifications and adaptations are possible and can even be desirable in certain circumstances and are a part of the present disclosure. Therefore, it is to be understood that this disclosure is not limited to the specific compositions, articles, devices, and methods disclosed unless otherwise specified. It is also to be understood that the terminology used herein is for the purpose of describing particular embodiments only and is not intended to be limiting. Features shown in the drawing are illustrative of selected embodiments of the present description and are not necessarily depicted in proper scale. These drawing features are exemplary, and are not intended to be limiting.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or description that the steps are to be limited to a specific order, it is no way intended that any particular order be inferred.

What is claimed is:

1. An article comprising:
a glass or glass-ceramic substrate having a first major surface and a second major surface opposite the first major surface, and a via extending through the substrate from the first major surface to the second major surface over an axial length in an axial direction, the via defining:
an interior surface; and
a first axial portion, a third axial portion, and a second axial portion disposed between the first axial portion and the third axial portion along the axial direction, the second axial portion comprising a waist such that a diameter of the interior surface is smaller at the waist than a diameter of the interior surface at the first axial portion and at the third axial portion;
a helium hermetic adhesion layer disposed on the interior surface in the first axial portion and in the third axial portion and adjacent to the first major surface and the second major surface; and
a metal connector disposed within the via, wherein the metal connector is adhered to the helium hermetic adhesion layer,
wherein:
the metal connector coats the interior surface of the via along the axial length of the via to define a first cavity from the first major surface to a first cavity length, the metal connector comprising a coating thickness of less than 12 µm at the first major surface;
the metal connector coats the interior surface of the via along the axial length of the via to define a second cavity from the second major surface to a second cavity length, the metal connector comprising a coating thickness of less than 12 µm at the second major surface;
the metal connector fully fills the via between the first cavity and the second cavity and within the second axial portion; and
the interior portion along the first axial portion comprises a first interior portion with a first slope and a second interior portion with a second slope, the first interior portion being between the helium hermetic adhesion layer and the second interior portion, the second interior portin being between the first interior portion and at the wasit, and the first slope being different from the second slope.

2. The article according to claim 1, wherein the metal connector comprises an average coating thickness of less than 12 µm in the first axial portion and the third axial portion.

3. The article according to claim 1, wherein the coating thickness within the via at the first major surface and the coating thickness within the via at the second major surface are each less than a coating thickness in the second axial portion.

4. The article according to claim 1, wherein the via has a first diameter at the first major surface, a second diameter at the second major surface, and a third diameter at the waist in the second axial portion, and wherein the third diameter is less than the first diameter and the second diameter.

5. The article according to claim 4, wherein the first diameter and the second diameter are each greater than or equal to 30 µm and less than or equal to 80 µm.

6. The article according to claim 5, wherein the third diameter is greater than or equal to 10 µm and less than or equal to 40 µm.

7. The article according to claim 4, wherein the coating thickness within the via at the first major surface and the coating thickness within the via at the second major surface are each less than one half of the third diameter.

8. The article according to claim 1, wherein the helium hermetic adhesion layer is not disposed on the interior surface in the second axial portion.

9. The article according to claim 1, wherein the helium hermetic adhesion layer is disposed along an entire perimeter of at least one of the first axial portion and the third axial portion.

10. The article according to claim 1, wherein the helium hermetic adhesion layer comprises one or more of Ti, Cr, TiN, Ni, Ta, W, and a metal oxide.

11. The article according to claim 1, wherein the metal connector consists essentially of copper.

12. The article according to claim 1, wherein at least one of the first cavity and the second cavity is filled with one or more materials that are not copper.

13. The article according to claim 1, wherein the article is free of cracks and has a helium permeability of less than $10^{-5}$ atm*cc/s before and after being heated to a temperature of 450° C. and cooled to a temperature of 23° C.

14. The article according to claim 1, wherein the substrate comprises at least 90 wt % silica.

* * * * *

UNITED STATES PATENT AND TRADEMARK OFFICE
CERTIFICATE OF CORRECTION

PATENT NO. : 11,201,109 B2
APPLICATION NO. : 16/776663
DATED : December 14, 2021
INVENTOR(S) : Mandakini Kanungo et al.

It is certified that error appears in the above-identified patent and that said Letters Patent is hereby corrected as shown below:

On the Title Page

On the Page 4, in item (56), in Column 1, under "Other Publications", Line 12, delete "(1989." and insert -- (1989). --.

On the Page 4, in item (56), in Column 1, under "Other Publications", Line 13, delete "Electroles" and insert -- Electroless --.

On the Page 4, in item (56), in Column 1, under "Other Publications", Line 15, delete "(2011." and insert -- (2011). --.

On the Page 4, in item (56), in Column 1, under "Other Publications", Line 19, delete "(ECTC." and insert -- (ECTC). --.

On the Page 4, in item (56), in Column 2, under "Other Publications", Line 3, delete "(2017." and insert -- (2017). --.

On the Page 4, in item (56), in Column 2, under "Other Publications", Line 7, delete "(2011." and insert -- (2011). --.

On the Page 4, in item (56), in Column 2, under "Other Publications", Line 10, delete "(2008." and insert -- (2008). --.

On the Page 4, in item (56), in Column 2, under "Other Publications", Line 12, delete "Barries" and insert -- Barriers --.

On the Page 4, in item (56), in Column 2, under "Other Publications", Line 14, delete "(2009." and insert -- (2009). --.

Signed and Sealed this
Third Day of May, 2022

Katherine Kelly Vidal
*Director of the United States Patent and Trademark Office*

CERTIFICATE OF CORRECTION (continued)
U.S. Pat. No. 11,201,109 B2

On the Page 4, in item (56), in Column 2, under "Other Publications", Line 30, delete "(2016." and insert -- (2016). --.

On the Page 4, in item (56), in Column 2, under "Other Publications", Line 31, delete "Contianing" and insert -- Containing --.

On the Page 4, in item (56), in Column 2, under "Other Publications", Line 33, delete "(2009." and insert -- (2009). --.

On the Page 4, in item (56), in Column 2, under "Other Publications", Line 38, delete "Aminosiline" and insert -- Aminosilane --.

On the Page 4, in item (56), in Column 2, under "Other Publications", Line 58, delete "(2013." and insert -- (2013). --.

On the Page 4, in item (56), in Column 2, under "Other Publications", Line 62, delete "(2011." and insert -- (2011). --.

On the Page 4, in item (56), in Column 2, under "Other Publications", Line 64, delete "Mirco" and insert -- Micro --.

On the Page 4, in item (56), in Column 2, under "Other Publications", Line 71, delete "(2014." and insert -- (2014). --.

On the Page 4, in item (56), in Column 2, under "Other Publications", Line 73, delete "Technolgy"," and insert -- Technology", --.

On the Page 4, in item (56), in Column 2, under "Other Publications", Line 73, delete "(2016." and insert -- (2016). --.

On the Page 5, in item (56), in Column 1, under "Other Publications", Lines 5-6, delete "Electornic Componsents" and insert -- Electronic Components --.

On the Page 5, in item (56), in Column 1, under "Other Publications", Line 7, delete "(2017." and insert -- (2017). --.

On the Page 5, in item (56), in Column 1, under "Other Publications", Line 23, delete "(2009." and insert -- (2009). --.

On the Page 5, in item (56), in Column 2, under "Other Publications", Line 12, delete "Enbineering;" and insert -- Engineering; --.

On the Page 5, in item (56), in Column 2, under "Other Publications", Line 24, delete "Packagingi" and insert -- Packaging --.

CERTIFICATE OF CORRECTION (continued)
U.S. Pat. No. 11,201,109 B2

On the Page 5, in item (56), in Column 2, under "Other Publications", Line 64, delete "for2.5D" and insert -- for 2.5D --.

In the Claims

In Column 18, Line 3, in Claim 1, delete "portin" and insert -- portion --.

In Column 18, Line 4, in Claim 1, delete "at the wasit," and insert -- the waist, --.